(12) United States Patent
Mangum et al.

(10) Patent No.: US 9,249,354 B2
(45) Date of Patent: *Feb. 2, 2016

(54) NETWORK OF SEMICONDUCTOR STRUCTURES WITH FUSED INSULATOR COATING

(71) Applicant: Pacific Light Technologies Corp., Portland, OR (US)

(72) Inventors: Benjamin Daniel Mangum, Tualatin, OR (US); Weiwen Zhao, Happy Valley, OR (US); Kari N. Haley, Portland, OR (US); Juanita N. Kurtin, Hillsboro, OR (US); Nathan Evan Stott, West Linn, OR (US)

(73) Assignee: Pacific Light Technologies Corp., Portland, OR (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/104,489

(22) Filed: Dec. 12, 2013

(65) Prior Publication Data

US 2015/0011029 A1 Jan. 8, 2015

Related U.S. Application Data

(63) Continuation-in-part of application No. 13/972,700, filed on Aug. 21, 2013.

(60) Provisional application No. 61/842,859, filed on Jul. 3, 2013.

(51) Int. Cl.
*H01L 21/00* (2006.01)
*C09K 11/88* (2006.01)
(Continued)

(52) U.S. Cl.
CPC ............... *C09K 11/883* (2013.01); *C09K 11/02* (2013.01); *H01L 33/502* (2013.01)

(58) Field of Classification Search
CPC ........ H01L 33/005; H01L 33/04; H01L 33/00
USPC .......................................................... 438/22
See application file for complete search history.

(56) References Cited

U.S. PATENT DOCUMENTS

| 7,933,022 B2 | 4/2011 | Smith et al. |
| 2007/0237460 A1 | 10/2007 | Fan et al. |

(Continued)

FOREIGN PATENT DOCUMENTS

| EP | 2472612 | 7/2012 |
| JP | 5035472 | 9/2012 |
| WO | WO-2012059931 | 5/2012 |

OTHER PUBLICATIONS

Brinker, et al. "Sol Gel Glass: I. Gelation and Gell Structure" Journal of Non-Crystalline Solids 70 (1985) 301-322.

(Continued)

*Primary Examiner* — Reema Patel
*Assistant Examiner* — Syed Gheyas
(74) *Attorney, Agent, or Firm* — Blakely Sokoloff Taylor & Zafman LLP

(57) ABSTRACT

Networks of semiconductor structures with fused insulator coatings and methods of fabricating networks of semiconductor structures with fused insulator coatings are described. In an example, a method of fabricating a semiconductor structure involves forming a mixture including a plurality of discrete semiconductor nanocrystals. Each of the plurality of discrete semiconductor nanocrystals is discretely coated by an insulator shell. The method also involves adding a base to the mixture to fuse the insulator shells of each of the plurality of discrete nanocrystals, providing an insulator network. Each of the plurality of discrete semiconductor nanocrystals is spaced apart from one another by the insulator network. The base one such as, but not limited to, LiOH, RbOH, CsOH, MgOH, $Ca(OH)_2$, $Sr(OH)_2$, $Ba(OH)_2$, $(Me)_4NOH$, $(Et)_4NOH$, or $(Bu)_4NOH$.

8 Claims, 24 Drawing Sheets

(51) Int. Cl.
*C09K 11/02* (2006.01)
*H01L 33/50* (2010.01)

(56) References Cited

U.S. PATENT DOCUMENTS

| | | | |
|---|---|---|---|
| 2007/0242713 | A1 | 10/2007 | Spariosu et al. |
| 2008/0038558 | A1 | 2/2008 | Landry et al. |
| 2008/0237540 | A1 | 10/2008 | Dubrow |
| 2010/0053930 | A1 | 3/2010 | Kim et al. |
| 2010/0086872 | A1* | 4/2010 | Ogihara et al. ............ 430/272.1 |
| 2010/0123155 | A1* | 5/2010 | Pickett .................. B82Y 15/00 257/98 |
| 2011/0176291 | A1 | 7/2011 | Sanders et al. |
| 2012/0211774 | A1 | 8/2012 | Harada |
| 2013/0112940 | A1 | 5/2013 | Kurtin et al. |
| 2013/0112941 | A1 | 5/2013 | Kurtin et al. |
| 2013/0112942 | A1 | 5/2013 | Kurtin et al. |
| 2014/0009902 | A1 | 1/2014 | Banin et al. |
| 2015/0008393 | A1* | 1/2015 | Mangum et al. ................ 257/14 |

OTHER PUBLICATIONS

Rosa-Fox, et al. "Organic-Inorganic Hybrid Materials from Sonogels" Apr. 26, 2002, 92 pgs.

Kurtin, Juanita N., U.S. Appl. No. 13/589,823, filed Aug. 20, 2012, 61 pgs.

International Search Report and Written Opinion from PCT/US2014/044663 mailed Oct. 16, 2014, 11 pgs.

Non-Final Office Action for U.S. Appl. No. 13/972,700, mailed Aug. 28, 2015.

Fan, et al., "Coupling semiconductor nanocrystals to a fused-silica microsphere: a quantum-dot microcavity with extremely high Q factors", Optics Letters, vol. 25, No. 21, (Nov. 1, 2000), pp. 1600-1602.

* cited by examiner

1850

Table 1900

| Sample ID | PLQY @ 120C with base | PL QY @ 120C without base |
|---|---|---|
| KNH02151-3 | 0.58 | 0.10 |
| KNH02151-5 | 0.50 | 0.18 |
| KNH02151-7 | 0.37 | 0.05 |
| KNH02151-9 | 0.48 | 0.05 |

2000A  2000B  2000C

WHITE LIGHT

US 9,249,354 B2

NETWORK OF SEMICONDUCTOR STRUCTURES WITH FUSED INSULATOR COATING

CROSS-REFERENCE TO RELATED APPLICATIONS

This application is a continuation-in-part of U.S. patent application Ser. No. 13/972,700, filed Aug. 21, 2013, which claims the benefit of U.S. Provisional Application No. 61/842,859, filed Jul. 3, 2013, the entire contents of which are hereby incorporated by reference herein.

TECHNICAL FIELD

Embodiments of the present invention are in the field of quantum dots for light emitting diodes (LEDs) and, in particular, networks of semiconductor structures with fused insulator coatings and methods of fabricating networks of semiconductor structures with fused insulator coatings.

BACKGROUND

Quantum dots having a high photoluminescence quantum yield (PLQY) may be applicable as down-converting materials in down-converting nanocomposites used in solid state lighting applications. Down-converting materials are used to improve the performance, efficiency and color choice in lighting applications, particularly light emitting diodes (LEDs). In such applications, quantum dots absorb light of a particular first (available or selected) wavelength, usually blue, and then emit light at a second wavelength, usually red or green.

SUMMARY

Embodiments of the present invention include networks of semiconductor structures with fused insulator coatings and methods of fabricating networks of semiconductor structures with fused insulator coatings.

In an embodiment, a method of fabricating a semiconductor structure involves forming a mixture including a plurality of discrete semiconductor nanocrystals. Each of the plurality of discrete semiconductor nanocrystals is discretely coated by an insulator shell. The method also involves adding a base to the mixture to fuse the insulator shells of each of the plurality of discrete nanocrystals, providing an insulator network. Each of the plurality of discrete semiconductor nanocrystals is spaced apart from one another by the insulator network. The base one such as, but not limited to, LiOH, RbOH, CsOH, MgOH, $Ca(OH)_2$, $Sr(OH)_2$, $Ba(OH)_2$, $(Me)_4NOH$, $(Et)_4NOH$, or $(Bu)_4NOH$.

In another embodiment, a method of fabricating a semiconductor structure involves forming a mixture including a plurality of discrete semiconductor nanocrystals. Each of the plurality of discrete semiconductor nanocrystals is discretely coated by an insulator shell material. The method also involves adding a base to the mixture to fuse the insulator shells of each of the plurality of discrete nanocrystals, providing an insulator network. Each of the plurality of discrete semiconductor nanocrystals is spaced apart from one another by the insulator network. The base one such as, but not limited to, LiOH, RbOH, CsOH, MgOH, $(Me)_4NOH$, $(Et)_4NOH$, or $(Bu)_4NOH$, and adding the base to the mixture involves adding one mole of the base for every two moles of the insulator shell material. The method also involves adding free silica to the mixture.

In another embodiment, a method of fabricating a semiconductor structure involves forming a mixture including a plurality of discrete semiconductor nanocrystals. Each of the plurality of discrete semiconductor nanocrystals is discretely coated by an insulator shell material. The method also involves adding a base to the mixture to fuse the insulator shells of each of the plurality of discrete nanocrystals, providing an insulator network. Each of the plurality of discrete semiconductor nanocrystals is spaced apart from one another by the insulator network. The base one such as, but not limited to, $Ca(OH)_2$, $Sr(OH)_2$ or $Ba(OH)_2$, and adding the base to the mixture involves adding one mole of the base for every four moles of the insulator shell material. The method also involves adding free silica to the mixture.

DETAILED DESCRIPTION

Figure 1:
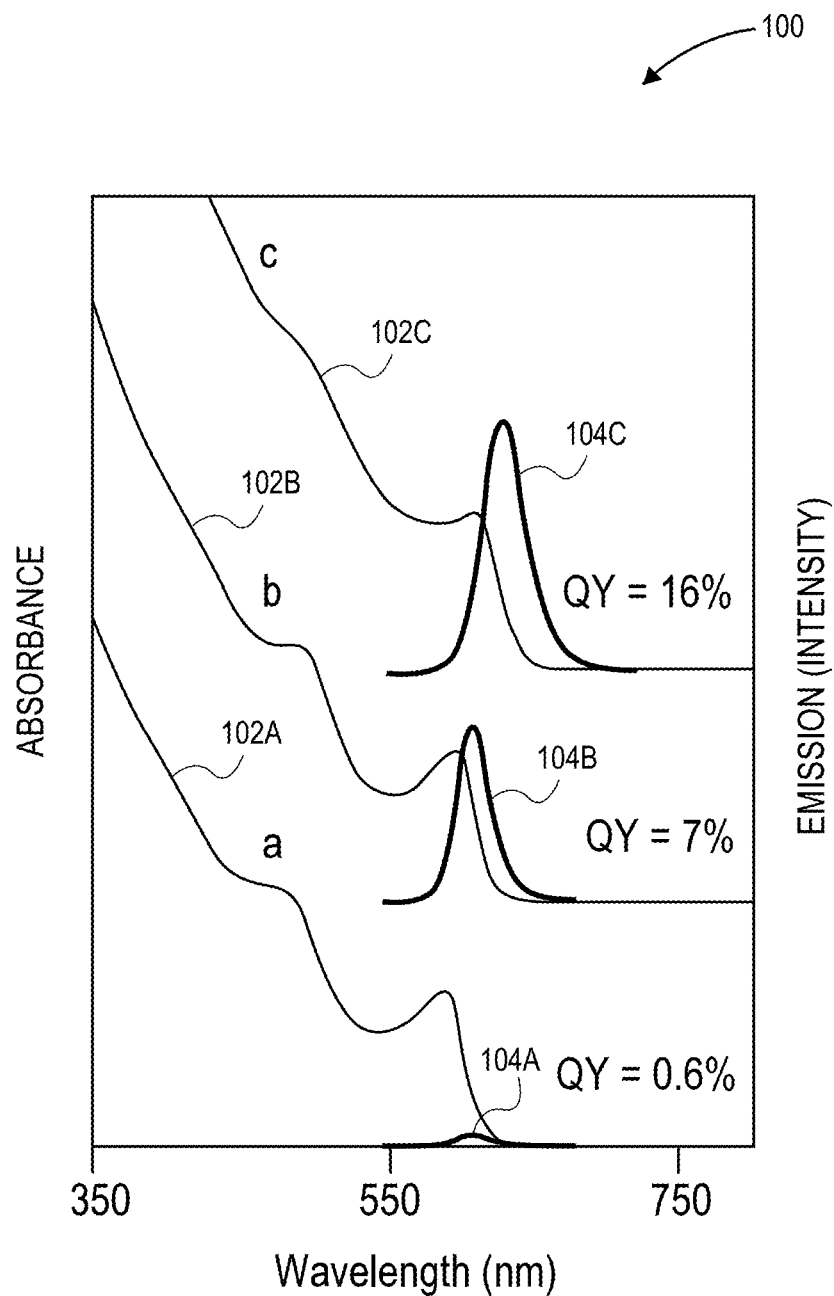
FIG. 1 depicts a plot of prior art core/shell absorption (left y-axis) and emission spectra intensity (right y-axis) as a function of wavelength for conventional quantum dots.

Networks of semiconductor structures with fused insulator coatings and methods of fabricating networks of semiconductor structures with fused insulator coatings are described herein. In the following description, numerous specific details are set forth, such as specific quantum dot geometries and efficiencies, in order to provide a thorough understanding of embodiments of the present invention. It will be apparent to one skilled in the art that embodiments of the present invention may be practiced without these specific details. In other instances, well-known related apparatuses, such as the host of varieties of applicable light emitting diodes (LEDs), are not described in detail in order to not unnecessarily obscure embodiments of the present invention. Furthermore, it is to be understood that the various embodiments shown in the figures are illustrative representations and are not necessarily drawn to scale.

Disclosed herein are quantum dots having high photoluminescence quantum yields (PLQY's) and methods of making and encapsulating such quantum dots. A high PLQY is achieved by using a synthetic process that significantly reduces the defects and self absorption found in prior art quantum dots. The resulting geometries of the quantum dots may include non-spherical quantum dot cores shelled with a rod-shaped shell. The aspect or volume ratio of the core/shell pairing may be controlled by monitoring the reaction process used to fabricate the pairing. Uses of quantum dot compositions having high PLQYs are also disclosed, including solid state lighting. Other applications include biological imaging and fabrication of photovoltaic devices. In particular embodiments, new aspects of silica shelling of semiconductor structures are described herein. In other embodiments, a network of quantum dots sharing a fused insulator coating is described. It is to be understood that the term "quantum dot" can be used to represent a variety of geometries such as, but not limited to, rods, spheres, or tetrapods, as well as asymmetric variations thereof.

As a reference point, quantum dots based on a spherical cadmium selenide (CdSe) core embedded in a cadmium sulfide (CdS) nanorod shell have been reported. Such quantum dots do not have a high PLQY. Typically, prior art core/shell quantum dots suffer from several structural deficiencies which may contribute to a reduced PLQY. For example, prior art core/shell quantum dots used for down-shifting applications typically have overlapping absorption and emission profiles. Profile overlap may be attributed to core material selection such that both the absorption and emission of the quantum dot is controlled by the size, shape, and composition of the core quantum dot, and the shell, if any, is used only as a passivating layer for the surface. However, the prior art arrangement leads to a significant amount of self-absorption (re-absorption of the down-shifted light), which decreases the measured PLQY. Accordingly, a typical prior art core/shell quantum dot PLQY is below 80% which is often not high enough for device applications. Also, prior art core/shell quantum dots suffer from self absorption due in part to inappropriate volume of core/shell material.

As an example, FIG. 1 depicts a plot 100 of prior art core/shell absorption and emission spectra intensity as a function of wavelength for conventional quantum dots. The absorption spectra (102a, 102b, 102c) are of CdSe core nanorods for a same core size with different thickness shells (a, b, c). FIG. 1 also depicts the emission spectra (104a, 104b, 104c) of the three core/shell quantum dots after exposure to laser light. The absorption spectrum and the emission spectrum overlap for each thickness of shell.

The low PLQY of prior art quantum dots is also attributed to poor nanocrystal surface and crystalline quality. The poor quality may result from a previous lack of capability in synthetic techniques for treating or tailoring the nanocrystal surface in order to achieve PLQYs above 90 percent. For example, the surface may have a large number of dangling bonds which act as trap states to reduce emission and, hence, PLQY. Previous approaches to address such issues have included use of a very thin shell, e.g., approximately ½ monolayer to 5 monolayers, or up to about 1.5 nm of thickness, to preserve the epitaxial nature of the shell. However, a PLQY of only 50-80% has been achieved. In such systems, considerable self-absorption may remain, decreasing the PLQY in many device applications. Other approaches have included attempts to grow a very large volume of up to 19 monolayers, or about 6 nm of shell material on a nanometer-sized quantum dot. However, the results have been less than satisfactory due to mismatched lattice constants between the core and shell material.

Conventionally, a spherical shell is grown on a spherical core in order to fabricate a core/shell quantum dot system. However, if too much volume of shell material is added to the core, the shell often will to crack due to strain. The strain introduces defects and decreases the PLQY. Band-edge emission from the quantum dots is then left to compete with both radiative and non-radiative decay channels, originating from defect electronic states. Attempts have been made to use an organic molecule as a passivating agent in order to improve the size-dependent band-edge luminescence efficiency, while preserving the solubility and processability of the particles. Unfortunately, however, passivation by way of organic molecule passivation is often incomplete or reversible, exposing some regions of the surface of a quantum dot to degradation effects such as photo-oxidation. In some cases, chemical degradation of the ligand molecule itself or its exchange with other ligands results in fabrication of poor quality quantum dots.

One or more embodiments of the present invention address at least one or more of the above issues regarding quantum dot quality and behavior and the impact on PLQY of the fabricated quantum dots. In one approach, the quality of quantum dot particle interfaces is improved over conventional systems. For example, in one embodiment, high PLQY temperature stability of a fabricated (e.g., grown) quantum dot is centered on the passivation or elimination of internal (at the seed/rod interface) and external (at the rod surface) interface defects that provide non-radiative recombination pathways for electron-hole pairs that otherwise compete with a desirable radiative recombination. This approach may be generally coincident with maximizing the room-temperature PLQY of the quantum dot particles. Thus, thermal escape paths from the quantum dot, assisted by quantum dot phonons, are mitigated as a primary escape mechanism for thermally excited carriers. Although the chemical or physical nature of such trap states has not been phenomenologically explored, suitably tuning electron density at the surface may deactivate trap states. Such passivation is especially important at increased temperatures, where carriers have sufficient thermal energy to access a larger manifold of these states.

In an embodiment, approaches described herein exploit the concept of trap state deactivation. Furthermore, maintenance of such a deactivation effect over time is achieved by insulating a quantum dot interface and/or outer most surface from an external environment. The deactivation of surface states is also important for the fabrication of polymer composites including quantum dots, particularly in the case where the polymer composite is exposed to a high flux light-source (as is the case for SSL) where it is possible for some of the particles to have more than one exciton. The multi-excitons may recombine radiatively or non-radiatively via Auger recombination to a single exciton state. For non-passivated quantum dot systems, the Auger rate increases with particle volume and with exciton population. However, in an embodiment, a thick, high quality, asymmetric shell of (e.g., of CdS) is grown on well-formed seeds (e.g., CdSe) to mitigate Auger rate increase.

One or more embodiments described herein involve an optimized synthesis of core/shell quantum dots. In a specific example, high PLQY and temperature stable quantum dots are fabricated from CdSe/CdS core-shell nanorods. In order to optimize the quantum dots in place of light emitting diode (LED) phosphors, the temperature stability of the quantum dots is enhanced, and the overall PLQY increased. Such improved performance is achieved while maintaining high absorption and narrow emission profiles for the quantum dots. In one such embodiment, materials systems described herein are tailored for separate optimization of absorption and emission by employing a core/shell structure. The core material predominantly controls the emission and the shell material predominantly controls the absorption. The described systems enable separate optimization of absorption and emission and provides very little overlap of the absorption and emission to minimize re-absorption of any emitted light by the quantum dot material (i.e., self-absorption).

Figure 2:
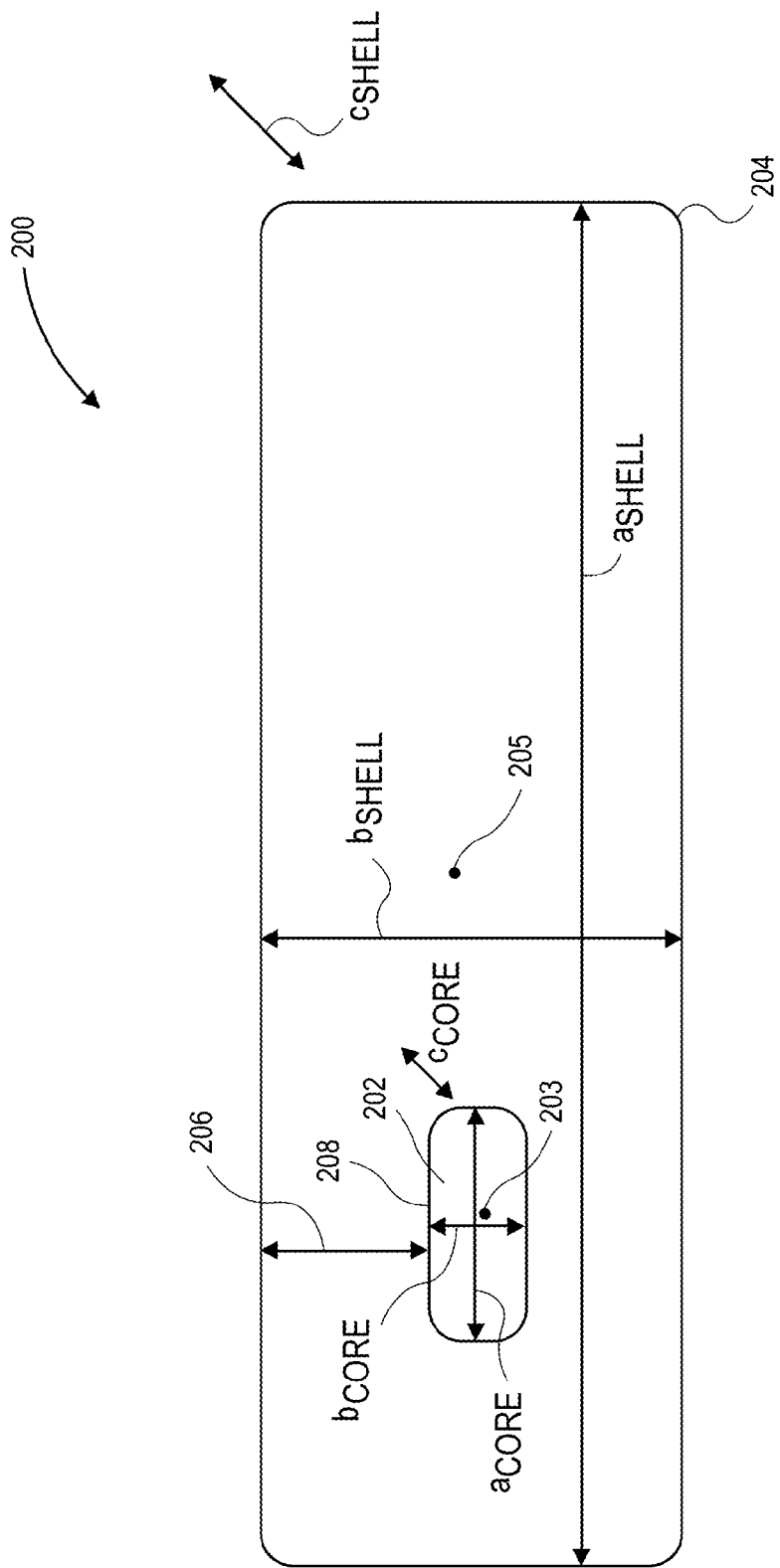
FIG. 2 illustrates a schematic of a cross-sectional view of a quantum dot, in accordance with an embodiment of the present invention.

Several factors may be intertwined for establishing an optimized geometry for a quantum dot having a nanocrystalline core and nanocrystalline shell pairing. As a reference, FIG. 2 illustrates a schematic of a cross-sectional view of a quantum dot, in accordance with an embodiment of the present invention. Referring to FIG. 2, a semiconductor structure (e.g., a quantum dot structure) 200 includes a nanocrystalline core 202 surrounded by a nanocrystalline shell 204. The nanocrystalline core 202 has a length axis ($a_{CORE}$), a width axis ($b_{CORE}$) and a depth axis ($c_{CORE}$), the depth axis provided into and out of the plane shown in FIG. 2. Likewise, the nanocrystalline shell 204 has a length axis ($a_{SHELL}$), a width axis ($b_{SHELL}$) and a depth axis ($c_{SHELL}$), the depth axis provided into and out of the plane shown in FIG. 2. The nanocrystalline core 202 has a center 203 and the nanocrystalline shell 204 has a center 205. The nanocrystalline shell 204 surrounds the nanocrystalline core 202 in the b-axis direction by an amount 206, as is also depicted in FIG. 2.

The following are attributes of a quantum dot that may be tuned for optimization, with reference to the parameters provided in FIG. 2, in accordance with embodiments of the present invention. Nanocrystalline core 202 diameter (a, b or c) and aspect ratio (e.g., a/b) can be controlled for rough tuning for emission wavelength (a higher value for either providing increasingly red emission). A smaller overall nanocrystalline core provides a greater surface to volume ratio. The width of the nanocrystalline shell along 206 may be tuned for yield optimization and quantum confinement providing approaches to control red-shifting and mitigation of surface effects. However, strain considerations must be accounted for when optimizing the value of thickness 206. The length ($a_{SHELL}$) of the shell is tunable to provide longer radiative decay times as well as increased light absorption. The overall aspect ratio of the structure 200 (e.g., the greater of $a_{SHELL}/b_{SHELL}$ and $a_{SHELL}/c_{SHELL}$) may be tuned to directly impact PLQY. Meanwhile, overall surface/volume ratio for 200 may be kept relatively smaller to provide lower surface defects, provide higher photoluminescence, and limit self-absorption. Referring again to FIG. 2, the shell/core interface 207 may be tailored to avoid dislocations and strain sites. In one such embodiment, a high quality interface is obtained by tailoring one or more of injection temperature and mixing parameters, the use of surfactants, and control of the reactivity of precursors, as is described in greater detail below.

In accordance with an embodiment of the present invention, a high PLQY quantum dot is based on a core/shell pairing using an anisotropic core. With reference to FIG. 2, an anisotropic core is a core having one of the axes $a_{CORE}$, $b_{CORE}$ or $c_{CORE}$ different from one or both of the remaining axes. An aspect ratio of such an anisotropic core is determined by the longest of the axes $a_{CORE}$, $b_{CORE}$ or $c_{CORE}$ divided by the shortest of the axes $a_{CORE}$, $b_{CORE}$ or $c_{CORE}$ to provide a number greater than 1 (an isotropic core has an aspect ratio of 1). It is to be understood that the outer surface of an anisotropic core may have rounded or curved edges (e.g., as in an ellipsoid) or may be faceted (e.g., as in a stretched or elongated tetragonal or hexagonal prism) to provide an aspect ratio of greater than 1 (note that a sphere, a tetragonal prism, and a hexagonal prism are all considered to have an aspect ratio of 1 in keeping with embodiments of the present invention).

A workable range of aspect ratio for an anisotropic nanocrystalline core for a quantum dot may be selected for maximization of PLQY. For example, a core essentially isotropic may not provide advantages for increasing PLQY, while a core with too great an aspect ratio (e.g., 2 or greater) may present challenges synthetically and geometrically when forming a surrounding shell. Furthermore, embedding the core in a shell composed of a material different than the core may also be used enhance PLQY of a resulting quantum dot.

Accordingly, in an embodiment, a semiconductor structure includes an anisotropic nanocrystalline core composed of a first semiconductor material and having an aspect ratio between, but not including, 1.0 and 2.0. The semiconductor structure also includes a nanocrystalline shell composed of a second, different, semiconductor material at least partially surrounding the anisotropic nanocrystalline core. In one such embodiment, the aspect ratio of the anisotropic nanocrystalline core is approximately in the range of 1.01-1.2 and, in a particular embodiment, is approximately in the range of 1.1-1.2. In the case of rounded edges, then, the nanocrystalline core may be substantially, but not perfectly, spherical. However, the nanocrystalline core may instead be faceted. In an embodiment, the anisotropic nanocrystalline core is disposed in an asymmetric orientation with respect to the nanocrystalline shell, as described in greater detail in the example below.

Another consideration for maximization of PLQY in a quantum dot structure is to provide an asymmetric orientation of the core within a surrounding shell. For example, referring again to FIG. 2, the center 203 of the core 202 may be misaligned with (e.g., have a different spatial point than) the center 205 of the shell 202. In an embodiment, a semiconductor structure includes an anisotropic nanocrystalline core composed of a first semiconductor material. The semiconductor structure also includes a nanocrystalline shell composed of a second, different, semiconductor material at least partially surrounding the anisotropic nanocrystalline core. The anisotropic nanocrystalline core is disposed in an asymmetric orientation with respect to the nanocrystalline shell. In one such embodiment, the nanocrystalline shell has a long axis (e.g., $a_{SHELL}$), and the anisotropic nanocrystalline core is disposed off-center along the long axis. In another such embodiment, the nanocrystalline shell has a short axis (e.g., $b_{SHELL}$), and the anisotropic nanocrystalline core is disposed off-center along the short axis. In yet another embodiment, however, the nanocrystalline shell has a long axis (e.g., $a_{SHELL}$) and a short axis (e.g., $b_{SHELL}$), and the anisotropic nanocrystalline core is disposed off-center along both the long and short axes.

With reference to the above described nanocrystalline core and nanocrystalline shell pairings, in an embodiment, the nanocrystalline shell completely surrounds the anisotropic nanocrystalline core. In an alternative embodiment, however, the nanocrystalline shell only partially surrounds the anisotropic nanocrystalline core, exposing a portion of the anisotropic nanocrystalline core, e.g., as in a tetrapod geometry or arrangement. In an embodiment, the nanocrystalline shell is an anisotropic nanocrystalline shell, such as a nano-rod, that surrounds the anisotropic nanocrystalline core at an interface between the anisotropic nanocrystalline shell and the anisotropic nanocrystalline core. The anisotropic nanocrystalline shell passivates or reduces trap states at the interface. The anisotropic nanocrystalline shell may also, or instead, deactivate trap states at the interface.

With reference again to the above described nanocrystalline core and nanocrystalline shell pairings, in an embodiment, the first and second semiconductor materials (core and shell, respectively) are each materials such as, but not limited to, Group II-VI materials, Group III-V materials, Group IV-VI materials, Group I-III-VI materials, or Group II-IV-VI materials and, in one embodiment, are monocrystalline. In one such embodiment, the first and second semiconductor materials are both Group II-VI materials, the first semiconductor material is cadmium selenide (CdSe), and the second semiconductor material is one such as, but not limited to, cadmium sulfide (CdS), zinc sulfide (ZnS), or zinc selenide (ZnSe). In an embodiment, the semiconductor structure further includes a nanocrystalline outer shell at least partially surrounding the nanocrystalline shell and, in one embodiment, the nanocrystalline outer shell completely surrounds the nanocrystalline shell. The nanocrystalline outer shell is composed of a third semiconductor material different from the first and second semiconductor materials. In a particular such embodiment, the first semiconductor material is cadmium selenide (CdSe), the second semiconductor material is cadmium sulfide (CdS), and the third semiconductor material is zinc sulfide (ZnS).

With reference again to the above described nanocrystalline core and nanocrystalline shell pairings, in an embodiment, the semiconductor structure (i.e., the core/shell pairing in total) has an aspect ratio approximately in the range of 1.5-10 and, 3-6 in a particular embodiment. In an embodiment, the nanocrystalline shell has a long axis and a short axis. The long axis has a length approximately in the range of 5-40 nanometers. The short axis has a length approximately in the range of 1-5 nanometers greater than a diameter of the anisotropic nanocrystalline core parallel with the short axis of the nanocrystalline shell. In a specific such embodiment, the anisotropic nanocrystalline core has a diameter approximately in the range of 2-5 nanometers. In another embodiment, the anisotropic nanocrystalline core has a diameter approximately in the range of 2-5 nanometers. The thickness of the nanocrystalline shell on the anisotropic nanocrystalline core along a short axis of the nanocrystalline shell is approximately in the range of 1-5 nanometers of the second semiconductor material.

With reference again to the above described nanocrystalline core and nanocrystalline shell pairings, in an embodiment, the anisotropic nanocrystalline core and the nanocrystalline shell form a quantum dot. In one such embodiment, the quantum dot has a photoluminescence quantum yield (PLQY) of at least 90%. Emission from the quantum dot may be mostly, or entirely, from the nanocrystalline core. For example, in an embodiment, emission from the anisotropic nanocrystalline core is at least approximately 75% of the total emission from the quantum dot. An absorption spectrum and an emission spectrum of the quantum dot may be essentially non-overlapping. For example, in an embodiment, an absorbance ratio of the quantum dot based on absorbance at 400 nanometers versus absorbance at an exciton peak for the quantum dot is approximately in the range of 5-35.

In an embodiment, a quantum dot based on the above described nanocrystalline core and nanocrystalline shell pairings is a down-converting quantum dot. However, in an alternative embodiment, the quantum dot is an up-shifting quantum dot. In either case, a lighting apparatus may include a light emitting diode and a plurality of quantum dots such as those described above. The quantum dots may be applied proximal to the LED and provide down-conversion or up-shifting of light emitted from the LED. Thus, semiconductor structures according to the present invention may be advantageously used in solid state lighting. The visible spectrum includes light of different colors having wavelengths between about 380 nm and about 780 nm that are visible to the human eye. An LED will emit a UV or blue light which is down-converted (or up-shifted) by semiconductor structures described herein. Any suitable ratio of color semiconductor structures may be used in devices of the present invention. LED devices according to embodiments of the present invention may have incorporated therein sufficient quantity of semiconductor structures (e.g., quantum dots) described herein capable of down-converting any available blue light to red, green, yellow, orange, blue, indigo, violet or other color.

Semiconductor structures according to embodiments of the present invention may be advantageously used in biological imaging in, e.g., one or more of the following environments: fluorescence resonance energy transfer (FRET) analysis, gene technology, fluorescent labeling of cellular proteins, cell tracking, pathogen and toxin detection, in vivo animal imaging or tumor biology investigation. Accordingly, embodiments of the present invention contemplate probes having quantum dots described herein.

Semiconductor structures according to embodiments of the present invention may be advantageously used in photovoltaic cells in layers where high PLQY is important. Accordingly, embodiments of the present invention contemplate photovoltaic devices using quantum dots described herein.

There are various synthetic approaches for fabricating CdSe quantum dots. For example, in an embodiment, under an inert atmosphere (e.g., ultra high purity (UHP) argon), cadmium oxide (CdO) is dissociated in the presence of surfactant (e.g., octadecylphosphonic acid (ODPA)) and solvent (e.g., trioctylphopshine oxide (TOPO); trioctylphosphine (TOP)) at high temperatures (e.g., 350-380 degrees Celsius). Resulting $Cd^{2+}$ cations are exposed by rapid injection to solvated selenium anions ($Se^{2-}$), resulting in a nucleation event forming small CdSe seeds. The seeds continue to grow, feeding off of the remaining $Cd^{2+}$ and $Se^{2-}$ available in solution, with the resulting quantum dots being stabilized by surface interactions with the surfactant in solution (ODPA). The aspect ratio of the CdSe seeds is typically between 1 and 2, as dictated by the ratio of the ODPA to the Cd concentration in solution. The quality and final size of these cores is affected by several variables such as, but not limited to, reaction time, temperature, reagent concentration, surfactant concentration, moisture content in the reaction, or mixing rate. The reaction is targeted for a narrow size distribution of CdSe seeds (assessed by transmission electron microscopy (TEM)), typically a slightly cylindrical seed shape (also assessed by TEM) and CdSe seeds exhibiting solution stability over time (assessed by PLQY and scattering in solution).

For the cadmium sulfide (CdS) shell growth on the CdSe seeds, or nanocrystalline cores, under an inert atmosphere (e.g. UHP argon), cadmium oxide (CdO) is dissociated in the presence of surfactants (e.g., ODPA and hexylphosphonic acid (HPA)) and solvent (e.g. TOPO and/or TOP) at high temperatures (e.g., 350-380 degrees Celsius). The resulting $Cd^{2+}$ cations in solution are exposed by rapid injection to solvated sulfur anions ($S^{2-}$) and CdSe cores. Immediate growth of the CdS shell around the CdSe core occurs. The use of both a short chain and long chain phosphonic acid promotes enhanced growth rate at along the c-axis of the structure, and slower growth along the a-axis, resulting in a rod-shaped core/shell nanomaterial.

CdSe/CdS core-shell quantum dots have been shown in the literature to exhibit respectable quantum yields (e.g., 70-75%). However, the persistence of surface trap states (which decrease overall photoluminescent quantum yield) in these systems arises from a variety of factors such as, but not limited to, strain at the core-shell interface, high aspect ratios (ratio of rod length to rod width of the core/shell pairing) which lead to larger quantum dot surface area requiring passivation, or poor surface stabilization of the shell.

In order to address the above synthetic limitations on the quality of quantum dots formed under conventional synthetic procedures, in an embodiment, a multi-faceted approach is used to mitigate or eliminate sources of surface trap states in quantum dot materials. For example, lower reaction temperatures during the core/shell pairing growth yields slower growth at the CdSe—CdS interface, giving each material sufficient time to orient into the lowest-strain positions. Aspect ratios are controlled by changing the relative ratios of surfactants in solution as well as by controlling temperature. Increasing an ODPA/HPA ratio in reaction slows the rapid growth at the ends of the core/shell pairings by replacing the facile HPA surfactant with the more obstructive ODPA surfactant. In addition, lowered reaction temperatures are also used to contribute to slowed growth at the ends of the core/shell pairings. By controlling these variables, the aspect ratio of the core/shell pairing is optimized for quantum yield. In one such embodiment, following determination of optimal surfactant ratios, overall surfactant concentrations are adjusted to locate a PLQY maximum while maintaining long-term stability of the fabricated quantum dots in solution. Furthermore, in an embodiment, aspect ratios of the seed or core (e.g., as opposed to the seed/shell pairing) are limited to a range between, but not including 1.0 and 2.0 in order to provide an appropriate geometry for high quality shell growth thereon.

In another aspect, an additional or alternative strategy for improving the interface between CdSe and CdS includes, in an embodiment, chemically treating the surface of the CdSe cores prior to reaction. CdSe cores are stabilized by long chain surfactants (ODPA) prior to introduction into the CdS growth conditions. Reactive ligand exchange can be used to replace the ODPA surfactants with ligands which are easier to remove (e.g., primary or secondary amines), facilitating improved reaction between the CdSe core and the CdS growth reagents.

In addition to the above factors affecting PLQY in solution, self-absorption may negatively affect PLQY when these materials are cast into films. This phenomenon may occur when CdSe cores re-absorb light emitted by other quantum dots. In one embodiment, the thickness of the CdS shells around the same CdSe cores is increased in order to increase the amount of light absorbed per core/shell pairing, while keeping the particle concentration the same or lower in films including the quantum dot structures. The addition of more Cd and S to the shell formation reaction leads to more shell growth, while an optimal surfactant ratio allows targeting of a desired aspect ratio and solubility of the core/shell pairing.

Accordingly, in an embodiment, an overall method of fabricating a semiconductor structure, such as the above described quantum dot structures, includes forming an anisotropic nanocrystalline core from a first semiconductor material. A nanocrystalline shell is formed from a second, different, semiconductor material to at least partially surround the anisotropic nanocrystalline core. In one such embodiment, the anisotropic nanocrystalline core has an aspect ratio between, but not including, 1.0 and 2.0, as described above.

With reference to the above described general method for fabricating a nanocrystalline core and nanocrystalline shell pairing, in an embodiment, prior to forming the nanocrystalline shell, the anisotropic nanocrystalline core is stabilized in solution with a surfactant. In one such embodiment, the surfactant is octadecylphosphonic acid (ODPA). In another such embodiment, the surfactant acts as a ligand for the anisotropic nanocrystalline core. In that embodiment, the method further includes, prior to forming the nanocrystalline shell, replacing the surfactant ligand with a second ligand, the second ligand more labile than the surfactant ligand. In a specific such embodiment, the second ligand is one such as, but not limited to, a primary amine or a secondary amine.

With reference again to the above described general method for fabricating a nanocrystalline core and nanocrystalline shell pairing, in an embodiment, forming the nanocrystalline shell includes forming the second semiconductor material in the presence of a mixture of surfactants. In one such embodiment, the mixture of surfactants includes a mixture of octadecylphosphonic acid (ODPA) and hexylphosphonic acid (HPA). In a specific such embodiment, forming the nanocrystalline shell includes tuning the aspect ratio of the nanocrystalline shell by tuning the ratio of ODPA versus HPA. Forming the second semiconductor material in the presence of the mixture of surfactants may also, or instead, include using a solvent such as, but not limited to, trioctylphosphine oxide (TOPO) and trioctylphosphine (TOP).

With reference again to the above described general method for fabricating a nanocrystalline core and nanocrystalline shell pairing, in an embodiment, forming the anisotropic nanocrystalline core includes forming at a temperature approximately in the range of 350-380 degrees Celsius. In an embodiment, forming the anisotropic nanocrystalline core includes forming a cadmium selenide (CdSe) nanocrystal from cadmium oxide (CdO) and selenium (Se) in the presence of a surfactant at a temperature approximately in the range of 300-400 degrees Celsius. The reaction is arrested prior to completion. In one such embodiment, forming the nanocrystalline shell includes forming a cadmium sulfide (CdS) nanocrystalline layer on the CdSe nanocrystal from cadmium oxide (CdO) and sulfur (S) at a temperature approximately in the range of 120-380 degrees Celsius. That reaction is also arrested prior to completion.

The aspect ratio of the fabricated semiconductor structures may be controlled by one of several methods. For example, ligand exchange may be used to change the surfactants and/or ligands and alter the growth kinetics of the shell and thus the aspect ratio. Changing the core concentration during core/shell growth may also be exploited. An increase in core concentration and/or decrease concentration of surfactants results in lower aspect ratio core/shell pairings. Increasing the concentration of a shell material such as S for CdS will increase the rate of growth on the ends of the core/shell pairings, leading to longer, higher aspect ratio core/shell pairings.

As mentioned above, in one embodiment of the present invention, nanocrystalline cores undergo a reactive ligand exchange which replaces core surfactants with ligands that are easier to remove (e.g., primary or secondary amines), facilitating better reaction between the CdSe core and the CdS growth reagents. In one embodiment, cores used herein have ligands bound or associated therewith. Attachment may be by dative bonding, Van der Waals forces, covalent bonding, ionic bonding or other force or bond, and combinations thereof. Ligands used with the cores may include one or more functional groups to bind to the surface of the nanocrystals. In a specific such embodiment, the ligands have a functional group with an affinity for a hydrophobic solvent.

In an embodiment, lower reaction temperatures during shell growth yields slower growth at the core/shell interface. While not wishing to be bound by any particular theory or principle it is believed that this method allows both core and shell seed crystals time to orient into their lowest-strain positions during growth. Growth at the ends of the core/shell pairing structure is facile and is primarily governed by the concentration of available precursors (e.g., for a shell of CdS this is Cd, S:TOP). Growth at the sides of the core/shell pairings is more strongly affected by the stabilizing ligands on the surface of the core/shell pairing. Ligands may exist in equilibrium between the reaction solution and the surface of the core/shell pairing structure. Lower reaction temperatures may tilt this equilibrium towards more ligands being on the surface, rendering it more difficult for growth precursors to access this surface. Hence, growth in the width direction is hindered by lower temperature, leading to higher aspect ratio core/shell pairings.

In general consideration of the above described semiconductor or quantum dot structures and methods of fabricating such semiconductor or quantum dot structures, in an embodiment, quantum dots are fabricated to have an absorbance in the blue or ultra-violet (V) regime, with an emission in the visible (e.g., red, orange, yellow, green, blue, indigo and violet, but particularly red and green) regime. The above described quantum dots may advantageously have a high PLQY with limited self-absorption, possess a narrow size distribution for cores, provide core stability over time (e.g., as assessed by PLQY and scattering in solution), and exhibit no major product loss during purification steps. Quantum dots fabricated according one or more of the above embodiments may have a decoupled absorption and emission regime, where the absorption is controlled by the shell and the emission is controlled by the core. In one such embodiment, the diameter of the core correlates with emission color, e.g., a core diameter progressing from 3-5.5 nanometers correlates approximately to a green→yellow→red emission progression.

With reference to the above described embodiments concerning semiconductor structures, such as quantum dots, and methods of fabricating such structures, the concept of a crystal defect, or mitigation thereof, may be implicated. For example, a crystal defect may form in, or be precluded from forming in, a nanocrystalline core or in a nanocrystalline shell, at an interface of the core/shell pairing, or at the surface of the core or shell. In an embodiment, a crystal defect is a departure from crystal symmetry caused by one or more of free surfaces, disorder, impurities, vacancies and interstitials, dislocations, lattice vibrations, or grain boundaries. Such a departure may be referred to as a structural defect or lattice defect. Reference to an exciton is to a mobile concentration of energy in a crystal formed by an excited electron and an associated hole. An exciton peak is defined as the peak in an absorption spectrum correlating to the minimum energy for a ground state electron to cross the band gap. The core/shell quantum dot absorption spectrum appears as a series of overlapping peaks that get larger at shorter wavelengths. Because of their discrete electron energy levels, each peak corresponds to an energy transition between discrete electron-hole (exciton) energy levels. The quantum dots do not absorb light that has a wavelength longer than that of the first exciton peak, also referred to as the absorption onset. The wavelength of the first exciton peak, and all subsequent peaks, is a function of the composition and size of the quantum dot. An absorbance ratio is absorbance of the core/shell nanocrystal at 400 nm divided by the absorbance of the core/shell nanocrystal at the first exciton peak. Photoluminescence quantum yield (PLQY) is defined as the ratio of the number of photons emitted to the number of photons absorbed. Core/shell pairing described herein may have a Type 1 band alignment, e.g., the core band gap is nested within the band gap of the shell. Emission wavelength may be determined by controlling the size and shape of the core nanocrystal, which controls the band gap of the core. Emission wavelength may also be engineered by controlling the size and shape of the shell. In an embodiment, the amount/volume of shell material is much greater than that of the core material. Consequently, the absorption onset wavelength is mainly controlled by the shell band gap. Core/shell quantum dots in accordance with an embodiment of the present invention have an electron-hole pair generated in the shell which is then funneled into the core, resulting in recombination and emission from the core quantum dot. Preferably emission is substantially from the core of the quantum dot.

Figure 3:
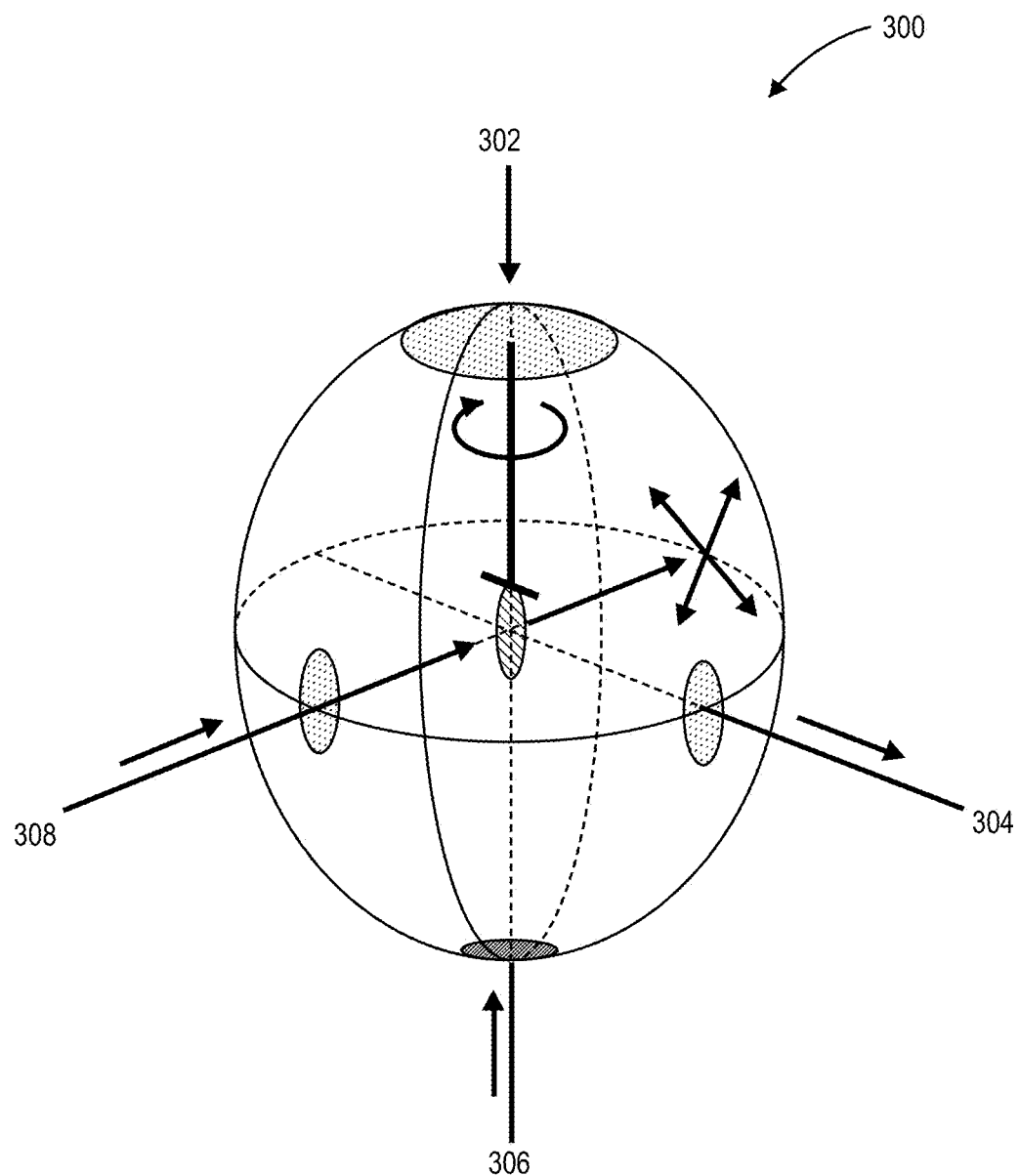
FIG. 3 illustrates a schematic of an integrating sphere for measuring absolute photoluminescence quantum yield, in accordance with an embodiment of the present invention.
Figure 4:
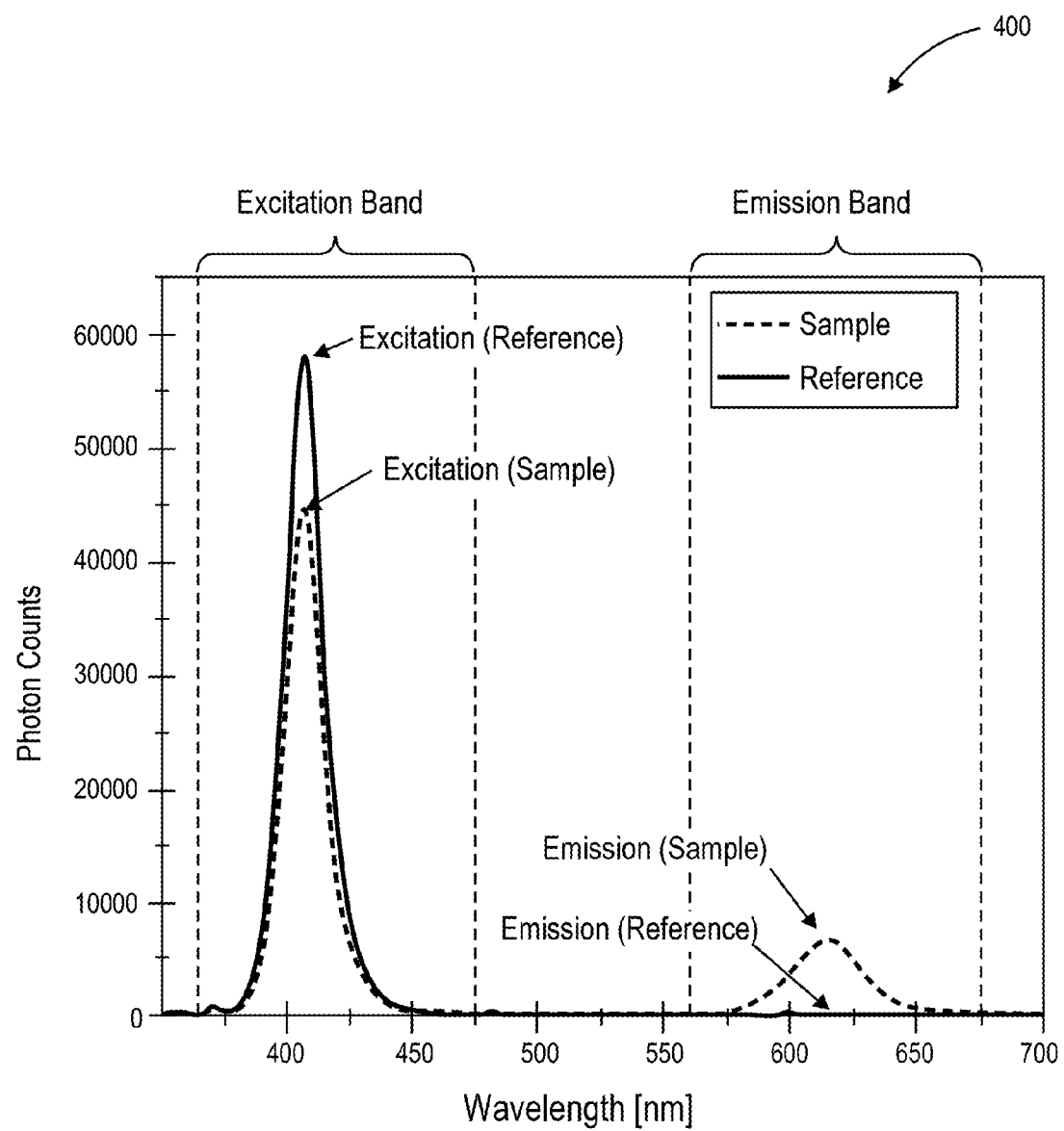
FIG. 4 is a plot of photon counts as a function of wavelength in nanometers for sample and reference emission spectra used in the measurement of photoluminescence quantum yield, in accordance with an embodiment of the present invention.

Measurement of Photoluminescence Quantum Yield (PLQY) may be performed according to the method disclosed in Laurent Pones et al. "Absolute Measurements of Photoluminescence Quantum Yields of Solutions Using an Integrating Sphere", *Journal of Fluorescence* (2006) DOI: 10.1007/s10895-005-0054-8, Springer Science+Business Media, Inc. As an example, FIG. 3 illustrates a schematic of an integrating sphere 300 for measuring absolute photoluminescence quantum yield, in accordance with an embodiment of the present invention. The integrating sphere 300 includes a sample holder 302, a spectrometer 304, a calibrated light source 306 and an ultra-violet (UV) LED 308. FIG. 4 is a plot 400 of photon counts as a function of wavelength in nanometers for sample and reference emission spectra used in the measurement of photoluminescence quantum yield, in accordance with an embodiment of the present invention. Referring to plot 400, both excitation and emission peaks for a sample are calibrated against corresponding excitation and emission peaks for a reference.

In an embodiment, PLQY is measured with a Labsphere™ 6" integrating sphere, a Labsphere™ LPS-100-0105 calibrated white light source, a 3.8 W, 405 nm Thorlabs™ M405L2 UV LED and an Ocean Optics™ USB4000-VIS-NIR spectrometer. The spectrometer and UV LED are coupled into the sphere using Ocean Optics™ UV-Vis optical fibers. The spectrometer fiber is attached to a lens in a port at the side of the sphere at 90 degrees relative to the excitation source. The lens is behind a flat baffle to ensure only diffuse light reaches the lens. The calibrated white light source is affixed to a port in the side of the sphere, at 90° to both the excitation source and the spectrometer port. Custom made sample holders are used to hold solid and solution (cuvette) samples and to rotate samples between direct and indirect measurement positions. Sample holders are coated with a barium sulfate diffuse reflective material. Before measurements are recorded, the calibrated white light source is used to calibrate the spectrometer as a function of wavelength (translating counts per second into relative intensity vs. wavelength). To measure PLQY, a reference sample is inserted into the sphere, and the excitation source LED signal is recorded. This reference sample is generally a blank, such as a cuvette containing a solvent or a sample without quantum dots, so as to only measure the properties of the quantum dots. If it is desirable to measure the properties of the matrix, the blank may be only the substrate. The sample is then inserted into the sphere, in direct beam line for direct measurements, and out of the beam for indirect measurements. The spectrum is recorded and split into excitation and emission bands, each is integrated, and the number of photons emitted per photons absorbed is the photoluminescence quantum yield (PLQY), which is equal to the difference between sample emission and reference emission divided by the difference of reference excitation and sample excitation.

Figure 5:
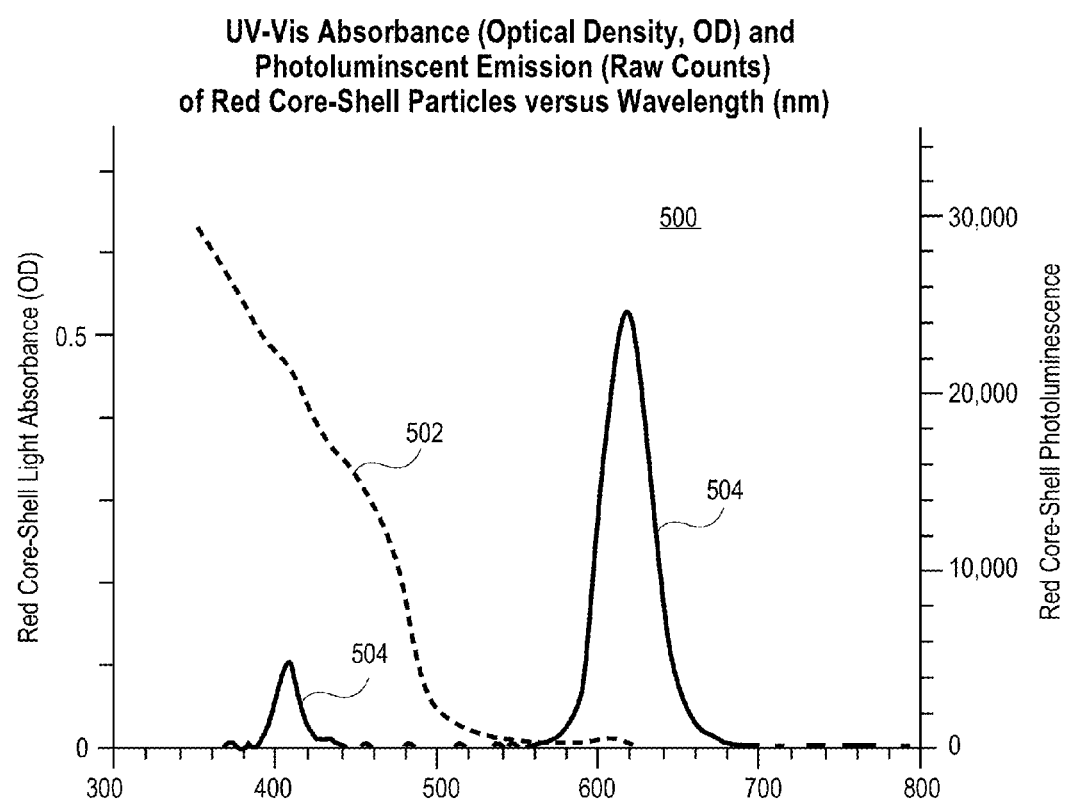
FIG. 5 is a plot including a UV-Vis absorbance spectrum and photoluminescent emission spectrum for red CdSe/CdS core/shell quantum dots, in accordance with an embodiment of the present invention.
Figure 6:
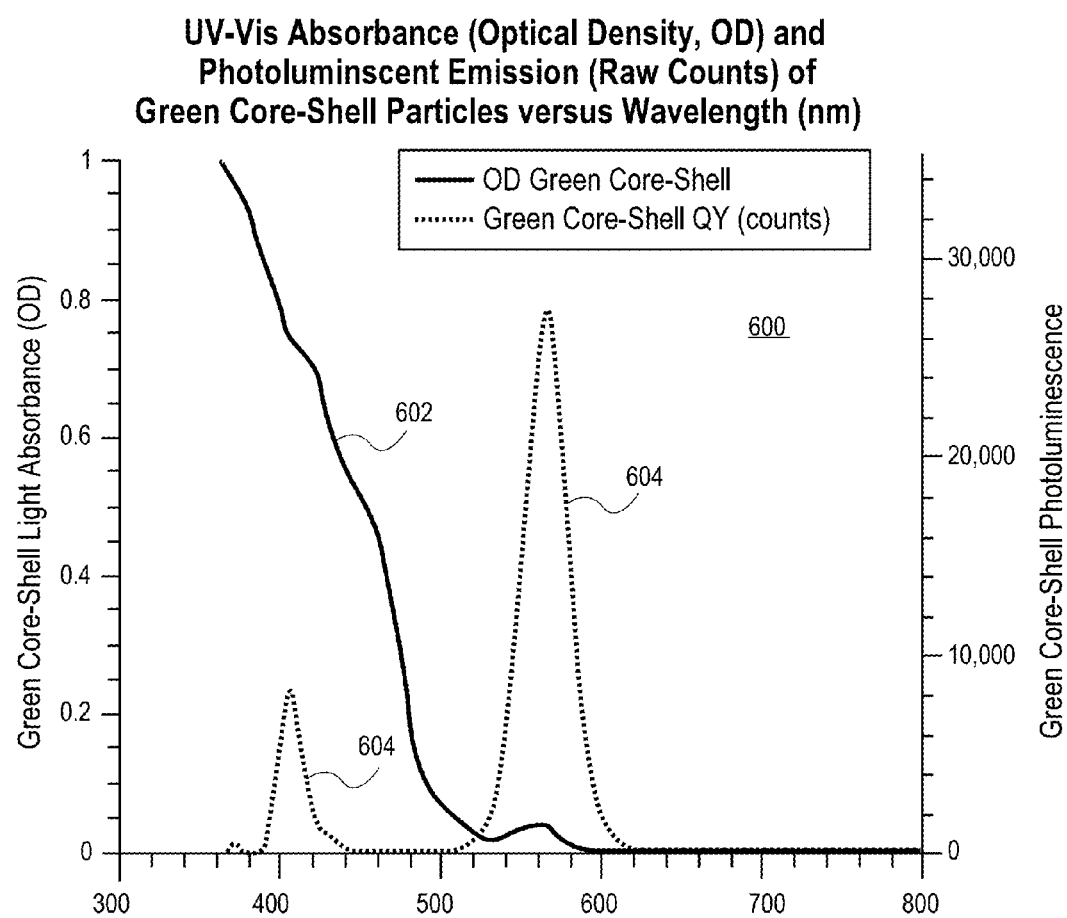
FIG. 6 is a plot including a UV-Vis absorbance spectrum and photoluminescent emission spectrum for a green CdSe/CdS core/shell quantum dot, in accordance with an embodiment of the present invention.

Quantum dots according to embodiments of the present invention have a PLQY between 90-100%, or at least 90%, more preferably at least 91%, more preferably at least 92%, more preferably at least 93%, more preferably at least 94%, more preferably at least 95%, more preferably at least 96%, more preferably at least 97%, more preferably at least 98%, more preferably at least 99% and most preferably 100%. FIG. 5 is a plot 500 including a UV-Vis absorbance spectrum 502 and photoluminescent emission spectrum 504 for red CdSe/CdS core/shell quantum dots, in accordance with an embodiment of the present invention. The quantum dots have essentially no overlapping absorption and emission bands and having an absorbance ratio of about 24. The PLQY was determined to be 94% at 617 nm. The average length (from transmission electron microscopy (TEM) data) is 27 nm±3.3 nm. The average width (from TEM data) is 7.9 nm±1.1 nm. The average aspect ratio (from TEM data) is 3.5±0.6. FIG. 6 is a plot 600 including a UV-Vis absorbance spectrum 602 and photoluminescent emission spectrum 604 for a green CdSe/CdS core/shell quantum dot, in accordance with an embodiment of the present invention. The quantum dot has a small extent of overlapping absorption and emission bands and has an absorbance ratio of 16 (plus or minus one).

In another aspect, semiconductor structures having a nanocrystalline core and corresponding nanocrystalline shell and insulator coating are described. Particularly, coated quantum dots structures and methods of making such structures are described below. In an embodiment, core/shell quantum dots are coated with silica by a method resulting in compositions having photoluminescence quantum yields between 90 and 100%. In one such embodiment, semiconductor structures are coated with silica using a reverse micelle method. A quantum dot may be engineered so that emission is substantially from the core.

Prior art quantum dots may have poor nanocrystal surface and crystalline quality as a result of prior art synthetic techniques not being capable of treating the nanocrystal surface in ways capable of achieving PLQYs above 90 percent. For example, the surface of a nanocrystalline core/shell pairing may have a large number of dangling bonds which act as trap states reducing emission and, therefore, PLQY. Prior art techniques to modify the quantum dot surface include coating quantum dots with silica. However, prior art silica coated quantum dots do not achieve the PLQY necessary for continued use in solid state lighting devices.

In conventional approaches, silica coatings can encapsulate more than one particle (e.g., quantum dot structure) at a time, or the approaches have resulted in incomplete encapsulation. One such conventional approach included coating a quantum dot with silica using self-assembled micelles. The approach requires the presence of a majority of a polar solvent to form a micelle. The requirement is for polar solvent environments to generate the encapsulating micelle, and thus limits the technique to aqueous based applications, such as biological tagging and imaging. Quantum dots with a hydrophobic surfactant or ligand attached are aqueous solution insoluble and thus silica cannot be precipitated with the nanocrystals within the aqueous domains of the micro emulsion. Ligand exchange reactions may be required which then leads to surface quality degradation. However, conventional quantum dot systems often rely on the weak dative Van der Waals bonding of ligands such as phosphonic acids, amines, and carboxylic acids to maintain the structures in solution and protect and passivate the surface of the quantum dot.

The integration of a quantum dot into a product may require protection for chemically compatibility with the solution environment during processing, and ultimately the plastic or gel used for encapsulation. Without such compatibility, particles are likely to aggregate and/or redistribute themselves within the matrix, an unacceptable occurrence in, for example, a solid state lighting product. Protection of the surface and maintenance of an electronically uniform environment also ensures that the density of non-radiative pathways (traps) is minimized, and that the emission energy (color) is as uniform as possible. Furthermore, the surface is protected from further chemical reaction with environmental degradants such as oxygen. This is particularly important for LED applications, where the quantum dot must tolerate temperatures as high as 200 degrees Celsius and constant high-intensity illumination with high-energy light. However, the weak surface bonding of prior art quantum dot ligands are non-ideal for the processing and long-term performance required of an LED product, as they allow degradants access to the quantum dot surface.

In accordance with an embodiment of the present invention, core/shell quantum dots coated with silica and other ligands to provide a structure having a high PLQY. One embodiment exploits a sol-gel process which encapsulates each quantum dot individually in a silica shell, resulting in a very stable high PLQY quantum dot particle. The coated quantum dots disclosed herein may advantageously possess a narrow size distribution for CdSe core stability over time (assessed by PLQY and scattering in solution).

In a general embodiment, a semiconductor structure includes a nanocrystalline core composed of a first semiconductor material. The semiconductor structure also includes a nanocrystalline shell composed of a second, different, semiconductor material at least partially surrounding the nanocrystalline core. An insulator layer encapsulates, e.g., coats, the nanocrystalline shell and nanocrystalline core. Thus, coated semiconductor structures include coated structures such as the quantum dots described above. For example, in an embodiment, the nanocrystalline core is anisotropic, e.g., having an aspect ratio between, but not including, 1.0 and 2.0. In another example, in an embodiment, the nanocrystalline core is anisotropic and is asymmetrically oriented within the nanocrystalline shell. In an embodiment, the nanocrystalline core and the nanocrystalline shell form a quantum dot.

With reference to the above described coated nanocrystalline core and nanocrystalline shell pairings, in an embodiment, the insulator layer is bonded directly to the nanocrystalline shell. In one such embodiment, the insulator layer passivates an outermost surface of the nanocrystalline shell. In another embodiment, the insulator layer provides a barrier for the nanocrystalline shell and nanocrystalline core impermeable to an environment outside of the insulator layer. In any case, the insulator layer may encapsulate only a single nanocrystalline shell/nanocrystalline core pairing. In an embodiment, the semiconductor structure further includes a nanocrystalline outer shell at least partially surrounding the nanocrystalline shell, between the nanocrystalline shell and the insulator layer. The nanocrystalline outer shell is composed of a third semiconductor material different from the semiconductor material of the shell and, possibly, different from the semiconductor material of the core.

With reference again to the above described coated nanocrystalline core and nanocrystalline shell pairings, in an embodiment, the insulator layer is composed of a layer of material such as, but not limited to, silica ($SiO_x$), titanium oxide ($TiO_x$), zirconium oxide ($ZrO_x$), alumina ($AlO_x$), or hafnia ($HfO_x$). In one such embodiment, the layer is a layer of silica having a thickness approximately in the range of 3-30 nanometers. In an embodiment, the insulator layer is an amorphous layer.

With reference again to the above described coated nanocrystalline core and nanocrystalline shell pairings, in an embodiment, an outer surface of the insulator layer is ligand-free. However, in an alternative embodiment, an outer surface of the insulator layer is ligand-functionalized. In one such embodiment, the outer surface of the insulator layer is ligand-functionalized with a ligand such as, but not limited to, a silane having one or more hydrolyzable groups or a functional or non-functional bipodal silane. In another such embodiment, the outer surface of the insulator layer is ligand-functionalized with a ligand such as, but not limited to, mono-, di-, or tri-alkoxysilanes with three, two or one inert or organo-functional substituents of the general formula $(R^1O)_3SiR^2$; $(R^1O)_2SiR^2R^3$; $(R^1O)SiR^2R^3R^4$, where $R^1$ is methyl, ethyl, propyl, isopropyl, or butyl, $R^2$, $R^3$ and $R^4$ are identical or different and are H substituents, alkyls, alkenes, alkynes, aryls, halogeno-derivates, alcohols, (mono, di, tri, poly)ethyleneglycols, (secondary, tertiary, quaternary) amines, diamines, polyamines, azides, isocyanates, acrylates, metacrylates, epoxies, ethers, aldehydes, carboxylates, esters, anhydrides, phosphates, phosphines, mercaptos, thiols, sulfonates, and are linear or cyclic, a silane with the general structure $(R^1O)_3Si-(CH_2)_n-R-(CH_2)_n-Si(RO)_3$ where R and $R^1$ is H or an organic substituent selected from the group consisting of alkyls, alkenes, alkynes, aryls, halogeno-derivates, alcohols, (mono, di, tri, poly)ethyleneglycols, (secondary, tertiary, quaternary) amines, diamines, polyamines, azides, isocyanates, acrylates, metacrylates, epoxies, ethers, aldehydes, carboxylates, esters, anhydrides, phosphates, phosphines, mercaptos, thiols, sulfonates, and are linear or cyclic, a chlorosilane, or an azasilane. In another such embodiment, the outer surface of the insulator layer is ligand-functionalized with a ligand such as, but not limited to, organic or inorganic compounds with functionality for bonding to a silica surface by chemical or non-chemical interactions such as but not limited to covalent, ionic, H-bonding, or Van der Waals forces. In yet another such embodiment, the outer surface of the insulator layer is ligand-functionalized with a ligand such as, but not limited to, the methoxy and ethoxy silanes $(MeO)_3SiAllyl$, $(MeO)_3SiVinyl$, $(MeO)_2SiMeVinyl$, $(EtO)_3SiVinyl$, $EtOSi(Vinyl)_3$, mono-methoxy silanes, chloro-silanes, or 1,2-bis-(triethoxysilyl)ethane. In any case, in an embodiment, the outer surface of the insulator layer is ligand-functionalized to impart solubility, dispersability, heat stability, photo-stability, or a combination thereof, to the semiconductor structure. For example, in one embodiment, the outer surface of the insulator layer includes OH groups suitable for reaction with an intermediate linker to link small molecules, oligomers, polymers or macromolecules to the outer surface of the insulator layer, the intermediate linker one such as, but not limited to, an epoxide, a carbonyldiimidazole, a cyanuric chloride, or an isocyanate.

With reference again to the above described coated nanocrystalline core and nanocrystalline shell pairings, in an embodiment, the nanocrystalline core has a diameter approximately in the range of 2-5 nanometers. The nanocrystalline shell has a long axis and a short axis, the long axis having a length approximately in the range of 5-40 nanometers, and the short axis having a length approximately in the range of 1-5 nanometers greater than the diameter of the nanocrystalline core. The insulator layer has a thickness approximately in the range of 1-20 nanometers along an axis co-axial with the long axis and has a thickness approximately in the range of 3-30 nanometers along an axis co-axial with the short axis.

A lighting apparatus may include a light emitting diode and a plurality of semiconductor structures which, e.g., act to down convert light absorbed from the light emitting diode. For example, in one embodiment, each semiconductor structure includes a quantum dot having a nanocrystalline core composed of a first semiconductor material and a nanocrystalline shell composed of a second, different, semiconductor material at least partially surrounding the nanocrystalline core. Each quantum dot has a photoluminescence quantum yield (PLQY) of at least 90%. An insulator layer encapsulates each quantum dot.

As described briefly above, an insulator layer may be formed to encapsulate a nanocrystalline shell and anisotropic nanocrystalline core. For example, in an embodiment, a layer of silica is formed using a reverse micelle sol-gel reaction. In one such embodiment, using the reverse micelle sol-gel reaction includes dissolving the nanocrystalline shell/nanocrystalline core pairing in a first non-polar solvent to form a first solution. Subsequently, the first solution is added along with a species such as, but not limited to, 3-aminopropyltrimethoxysilane (APTMS), 3-mercapto-trimethoxysilane, or a silane comprising a phosphonic acid or carboxylic acid functional group, to a second solution having a surfactant dissolved in a second non-polar solvent. Subsequently, ammonium hydroxide and tetraethylorthosilicate (TEOS) are added to the second solution.

Figure 7:
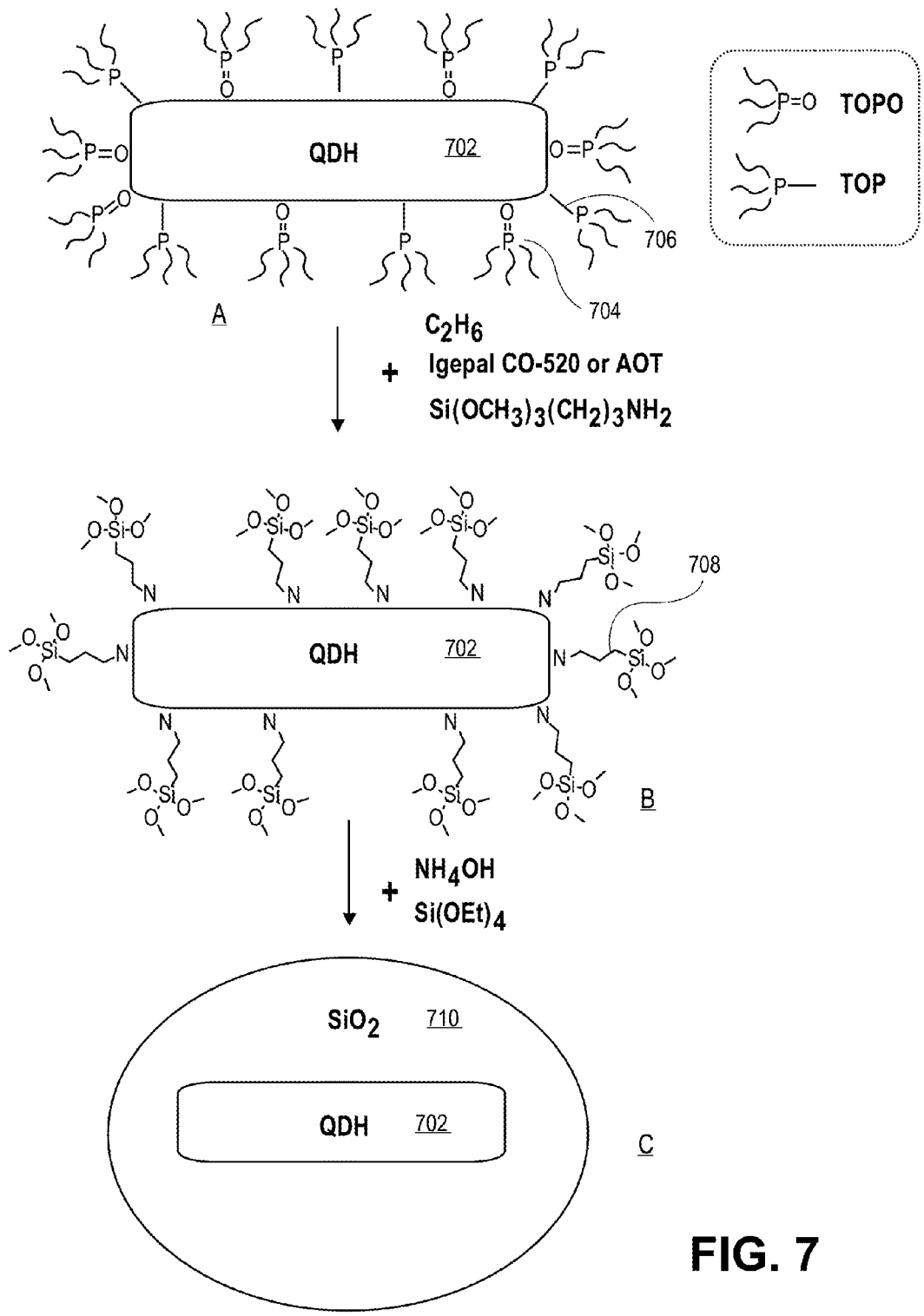
FIG. 7 illustrates operations in a reverse micelle approach to coating a semiconductor structure, in accordance with an embodiment of the present invention.
Figure 8:
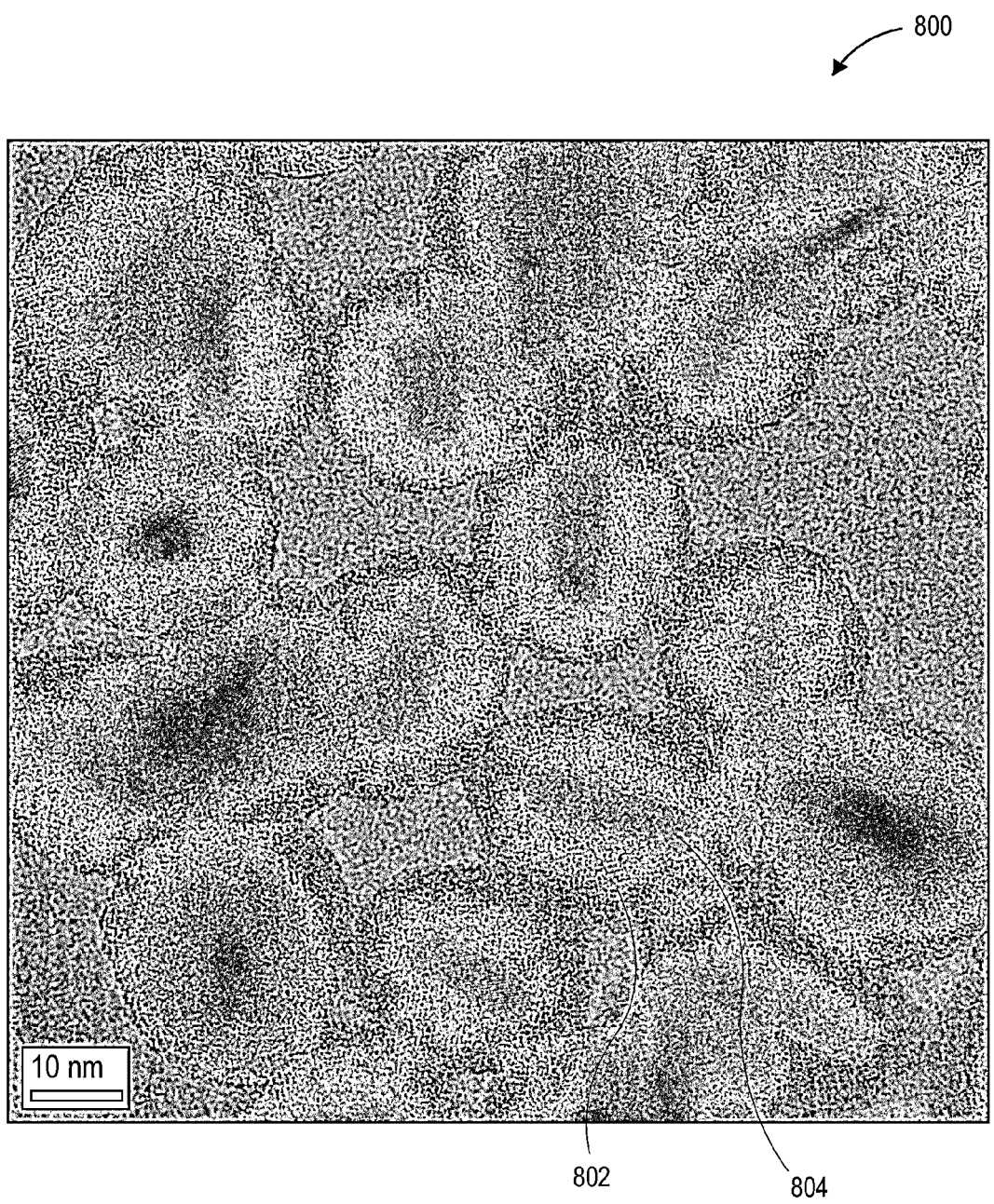
FIG. 8 is a transmission electron microscope (TEM) image of silica coated CdSe/CdS core/shell quantum dots having complete silica encapsulation, in accordance with an embodiment of the present invention.

Thus, semiconductor nanocrystals coated with silica according to the present invention may be made by a sol-gel reaction such as a reverse micelle method. As an example, FIG. 7 illustrates operations in a reverse micelle approach to coating a semiconductor structure, in accordance with an embodiment of the present invention. Referring to part A of FIG. 7, a quantum dot heterostructure (QDH) 702 (e.g., a nanocrystalline core/shell pairing) has attached thereto a plurality of TOPO ligands 704 and TOP ligands 706. Referring to part B, the plurality of TOPO ligands 704 and TOP ligands 706 are exchanged with a plurality of $Si(OCH_3)_3(CH_2)_3NH_2$ ligands 708. The structure of part B is then reacted with TEOS $(Si(OEt)_4)$ and ammonium hydroxide $(NH_4OH)$ to form a silica coating 710 surrounding the QDH 702, as depicted in part C of FIG. 7. FIG. 8 is a transmission electron microscope (TEM) image 800 of silica coated 802 CdSe/CdS core/shell quantum dots 804 having complete silica encapsulation, in accordance with an embodiment of the present invention. Thus, a reverse micelle is formed after adding ammonium hydroxide and tetraethylorthosilicate (TEOS), the source for the silica coating. TEOS diffuses through the micelle and is hydrolyzed by ammonia to form a uniform $SiO_2$ shell on the surface of the quantum dot. This approach may offer great flexibility to incorporate quantum dots of different sizes. In one such embodiment, the thickness of the insulator layer formed depends on the amount of TEOS added to the second solution.

With reference again to the above described method of forming coated nanocrystalline core and nanocrystalline shell pairings, in an embodiment, the first and second non-polar solvents are cyclohexane. In an embodiment, forming the coating layer includes forming a layer of silica and further includes using a combination of dioctyl sodium sulfosuccinate (AOT) and tetraethylorthosilicate (TEOS). In another embodiment, however, forming the layer includes forming a layer of silica and further includes using a combination of polyoxyethylene (5) nonylphenylether and tetraethylorthosilicate (TEOS). In another embodiment, however, forming the layer includes forming a layer of silica and further includes using cationic surfactants such as CTAB (cetyltrimethylammonium bromide), anionic surfactants, non-ionic surfactants, or pluronic surfactants such as Pluronic F 127 (an ethylene oxide/propylene oxide block copolymer) as well as mixtures of surfactants.

Upon initiation of growth of a silica shell, the final size of that shell may be directly related to the amount of TEOS in the reaction solution. Silica coatings according to embodiments of the present invention may be conformal to the core/shell QDH or non-conformal. A silica coating may be between about 3 nm and 30 nm thick. The silica coating thickness along the c-axis may be as small as about 1 nm or as large as about 20 nm. The silica coating thickness along the a-axis may be between about 3 nm and 30 nm. Once silica shelling is complete, the product is washed with solvent to remove any remaining ligands. The silica coated quantum dots can then be incorporated into a polymer matrix or undergo further surface functionalization. However, silica shells according to embodiments of the present invention may also be functionalized with ligands to impart solubility, dispersability, heat stability and photo-stability in the matrix.

The above examples of silica shelling represent reverse micelle processes, basic examples of which are provided below in experimental examples 6 and 7. Additional aspects of silica (or other insulator coating) shelling can involve somewhat more sophisticated control of the shelling process. In a first additional aspect of silica shelling considerations, silica shell sizing control can be achieved. For example, in an embodiment, the thickness of the silica shell can be controlled approximately in a range of 0-100 nanometer total diameter with a delta of approximately 5 nanometers. In one such embodiment, an amount of tetraethylorthosilicate (TEOS) is increased at the beginning of a shelling reaction, and further injecting additional TEOS one or more additional times throughout the shelling process. In a specific such embodiment, a syringe pump is used to increase the overall amount of TEOS but dispensing is performed slowly during the reaction time. Upon initiation of growth of a silica shell, the final size of the shell can be controlled by the amount of TEOS and injection method. To provide further context, when growing shells thicker than approximately 30 nanometers, it may be critical to control the amount and rate of TEOS entering into the reaction mixture to avoid forming free silica particles.

Figure 13:
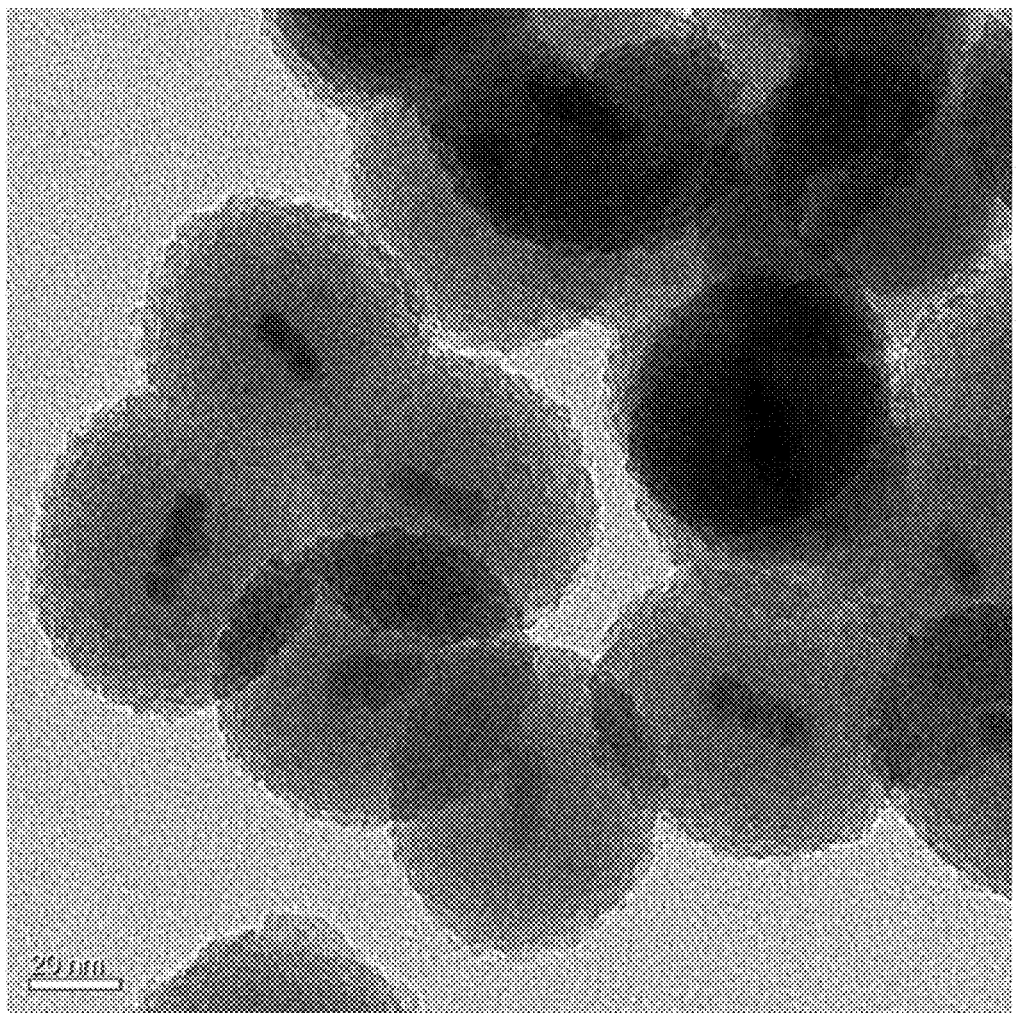
FIG. 13 is a transmission electron microscope image of the resulting silica shelling product from experimental example 17, in accordance with an embodiment of the present invention.
Figure 14:
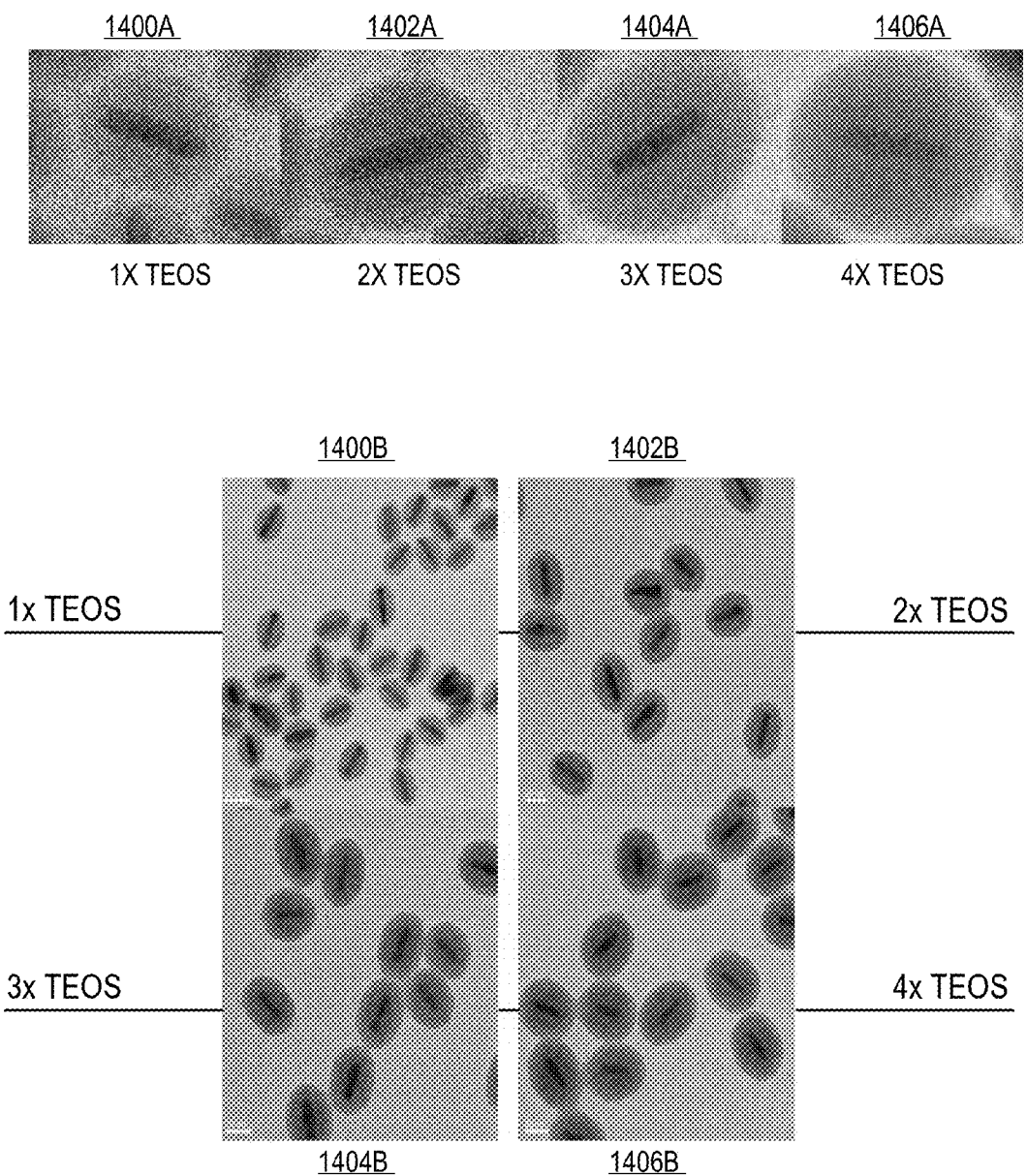
FIG. 14 includes transmission electron microscope images of the resulting silica shelling products from experimental example 18, in accordance with an embodiment of the present invention.

In one embodiment, a silica shell with a targeted thickness can be obtained by injecting TEOS using a syringe pump to control the growth rate and amount of TEOS entering into the reaction mixture. For example, FIG. 13 is a transmission electron microscope image 1300 of the resulting silica shelling product from experimental example 17 below, in accordance with an embodiment of the present invention. In another embodiment, the size of the silica shell is controlled by multiple injections of TEOS at pre-defined time interval. For example, FIG. 14 includes transmission electron microscope images 1400A-1406A and 1400B-1406B of the resulting silica shelling products from experimental example 18 below, in accordance with an embodiment of the present invention. Referring to FIG. 14, resulting product images are provided for scenarios involving one additional (1×), two additional (2×), three additional (3×), or four additional (4×) injections of TEOS throughout the reaction procedure.

Figure 15:
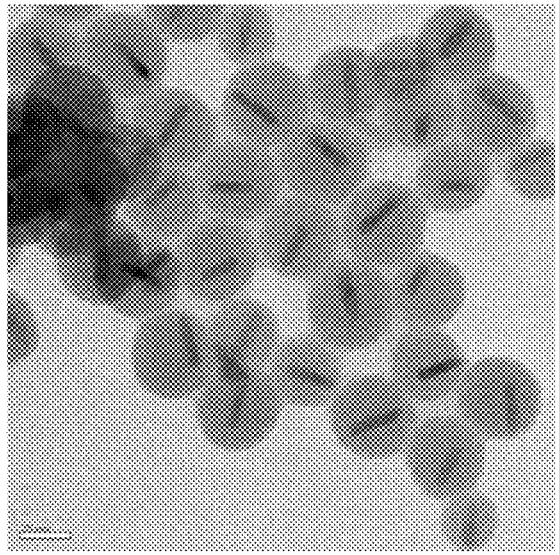
FIG. 15 is a transmission electron microscope image of the resulting silica shelling product from experimental example 19, in accordance with an embodiment of the present invention.

In a second additional aspect of silica shelling considerations, potassium hydroxide (KOH) can be used to form a micelle instead of ammonium hydroxide. For example, in an embodiment, an insulator layer is formed to encapsulate a nanocrystalline shell and anisotropic nanocrystalline core. In one such embodiment, a layer of silica is formed using a reverse micelle sol-gel reaction. Using the reverse micelle sol-gel reaction includes dissolving the nanocrystalline shell/nanocrystalline core pairing in a first non-polar solvent to form a first solution. Subsequently, the first solution is added along with a species such as, but not limited to, 3-aminopropyltrimethoxysilane (APTMS), 3-mercapto-trimethoxysilane, or a silane having a phosphonic acid or carboxylic acid functional group, to a second solution having a surfactant dissolved in a second non-polar solvent. Subsequently, potassium hydroxide aqueous solution and tetraethylorthosilicate (TEOS) are added to the second solution. As an example, FIG. 15 is a transmission electron microscope image 1500 of the resulting silica shelling product from experimental example 19 below, in accordance with an embodiment of the present invention.

Figure 16:
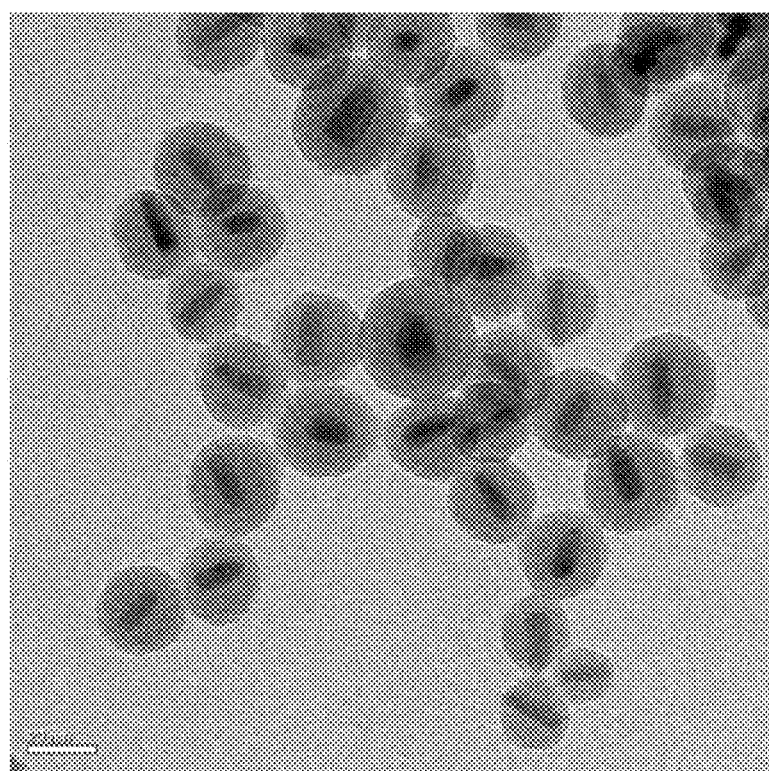
FIG. 16 is a transmission electron microscope image of the resulting silica shelling product from experimental example 20, in accordance with an embodiment of the present invention.
Figure 17:
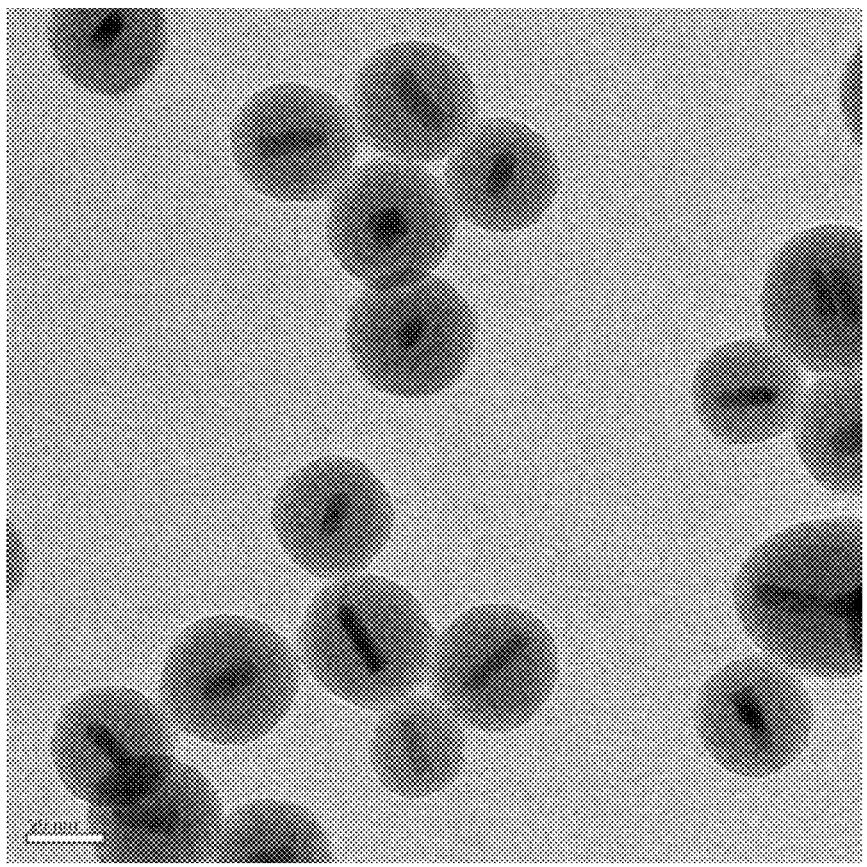
FIG. 17 is a transmission electron microscope image of the resulting silica shelling product from experimental example 21, in accordance with an embodiment of the present invention.

In a third additional aspect of silica shelling considerations, tetrapropylorthosilicate (TPOS) and/or tetrabutylorthosilicate (TBOS) can be used as silica sources. As mentioned above, semiconductor nanocrystals coated with silica according to the present invention may be made by a sol-gel reaction such as a reverse micelle method. In an embodiment, TEOS is used as source to form silica layer. In another embodiment, however, the forming of a silica layer includes using tetrapropylorthosilicate (TPOS). In another embodiment, forming the layer includes using tetrabutylorthosilicate (TBOS) as silica source. FIGS. 16 and 17 are transmission electron microscope images 1600 and 1700, respectively, of the resulting silica shelling product from related experimental examples 20 and 21, respectively, below, in accordance with an embodiment of the present invention.

Figure 18A:
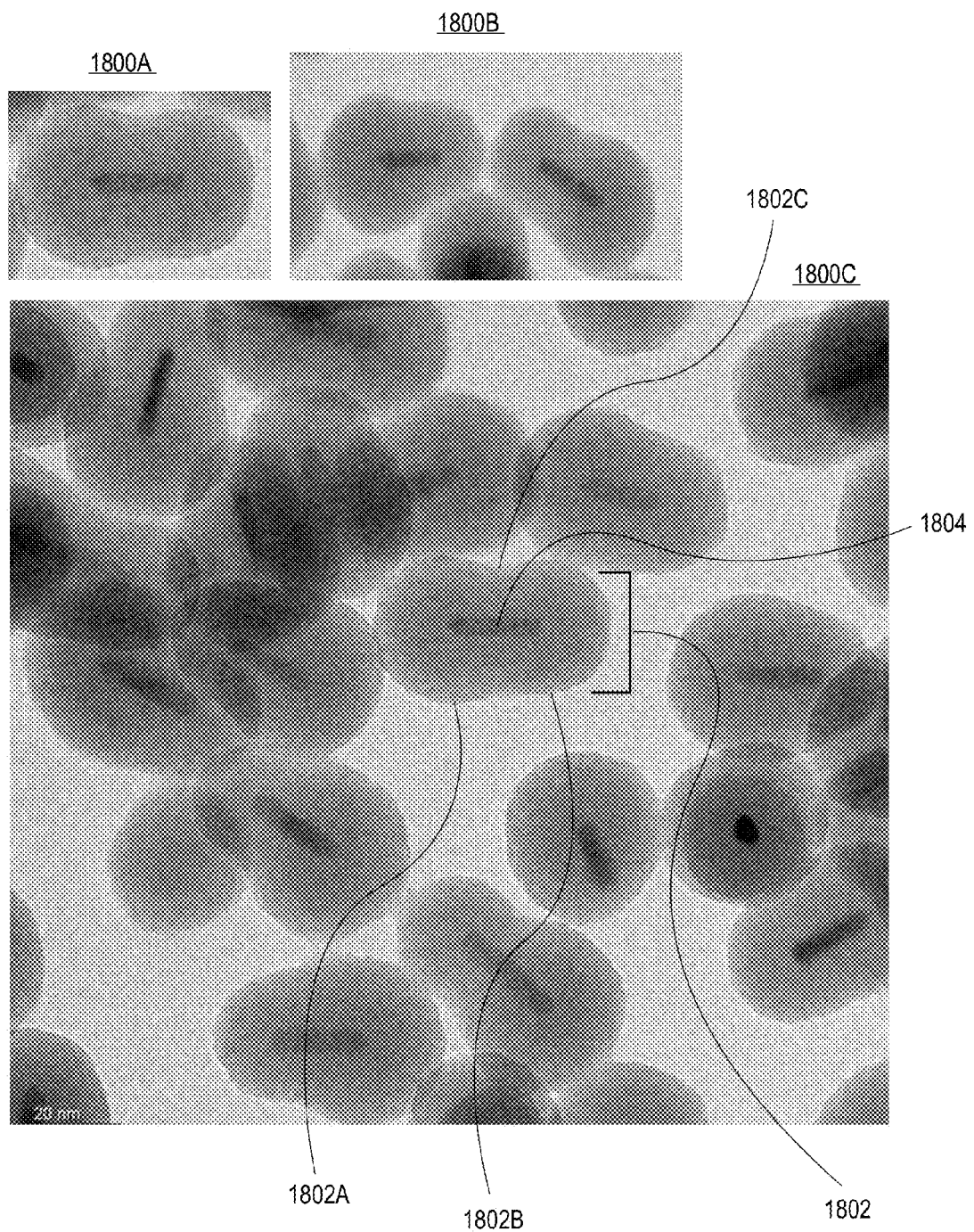
FIG. 18A includes transmission electron microscope images of the resulting silica shelling products from experimental example 22A, in accordance with an embodiment of the present invention.

In a fourth additional aspect of silica shelling considerations, silica shell morphology can be controlled. For example, in an embodiment, non-spherical shapes are obtained by varying the identity of the reactants. It is to be understood, however, that final shape may depend on the starting shape. For example, a rod starting shape may lead to oblong shells, while a spherical starting shape may lead to spheres. Also, with increasingly thick shells, increasingly round shells may be obtained. Such final shapes, then, may alternatively obtained regardless of the specific reactants employed. As briefly described above, silica shells may be formed using the reverse micelle sol-gel reaction includes dissolving the nanocrystalline shell/nanocrystalline core pairing in a first non-polar solvent to form a first solution. Subsequently, the first solution is added along with a species such as, but not limited to, 3-aminopropyltrimethoxysilane (APTMS), 3-mercapto-trimethoxysilane, or a silane comprising a phosphonic acid or carboxylic acid functional group, to a second solution having a surfactant dissolved in a second non-polar solvent. Subsequently, ammonium hydroxide and tetraethylorthosilicate (TEOS) are added to the second solution. In general, oblong shaped shells are produced. However, non-oblong shaped shells may be produced by omitting the 3-aminopropyltrimethoxysilane (APTMS). FIG. 18A includes transmission electron microscope images 1800A-1800C of the resulting silica shelling products from experimental example 22A below, in accordance with an embodiment of the present invention. Referring to image 1800C, an individual quantum dot includes a silica coating 1802 with a central nanocrystal 1804. The silica coating 1802 includes two bulbous portions 1802A and 1802B which are separated by a pinch or waist portion 1802C. The term "dumbbell" with respect to the resulting silica-coating shape includes symmetric structures (e.g., hourglass type shapes) as well as asymmetric structures (e.g., pear type shapes).

Figure 18B:
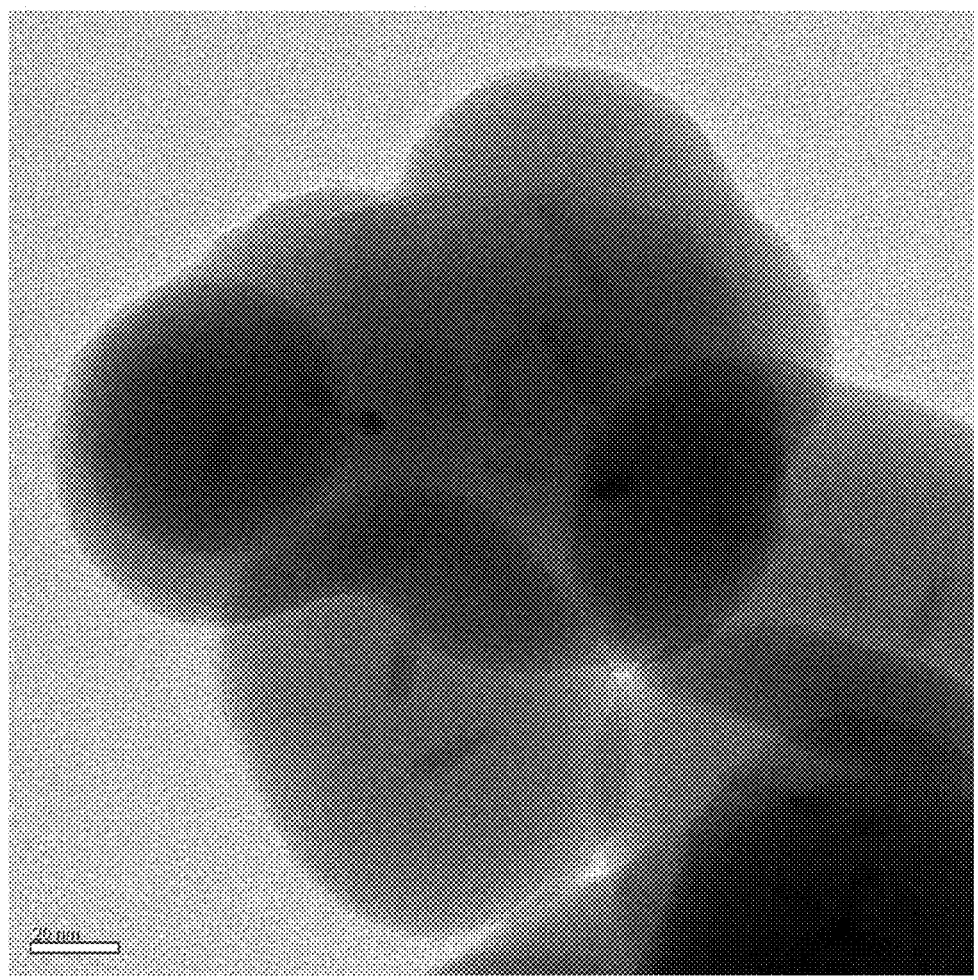
FIG. 18B includes a transmission electron microscope image of the resulting silica shelling products from experimental example 22B, in accordance with an embodiment of the present invention.

In yet another additional aspect of silica shelling considerations, a Stobër Process has been widely used for synthesizing spherical and monodispersed silica particles. The process typically involves the hydrolysis of a silica precursor in ethanol, water and ammonium hydroxide medium. The method is effective and works well for large silica particles with diameters of hundreds nanometers to a few microns. Here, in an embodiment, in order to further improve the protection and insulation, nanocrystals shelled with silica by reverse micelle method are subjected for addition shell growth using the Stober method. As described briefly above, an insulator layer may be formed to encapsulate a nanocrystalline shell and anisotropic nanocrystalline core. For example, in an embodiment, a layer of silica is formed using a reverse micelle sol-gel reaction. In one such embodiment, using the reverse micelle sol-gel reaction includes dissolving the nanocrystalline shell/nanocrystalline core pairing in a first non-polar solvent to form a first solution. Subsequently, the first solution is added along with a species such as, but not limited to, 3-aminopropyltrimethoxysilane (APTMS), 3-mercapto-trimethoxysilane, or a silane comprising a phosphonic acid or carboxylic acid functional group, to a second solution having a surfactant dissolved in a second non-polar solvent. Subsequently, ammonium hydroxide and tetraorthosilicate (TEOS) are added to the second solution. The micelles are broken up by IPA and collected using a centrifuge. The $SiO_2$ coated particles are dispersed in either methanol (MeOH) or ethanol (EtOH). Small amounts of water, ammonia and TEOS are added to the nanoparticles solution sequentially to start the growth of additional silica shell by Stober method. Again, upon initiation of growth of additional silica shell, the final size of the shell can be controlled by the amount of TEOS and injection method. It is to be understood that it may be necessary to control the amount and rate of TEOS entering into the reaction mixture to avoid forming free silica particles. FIG. 18B includes a transmission electron microscope image 1850 of the resulting silica shelling products from experimental example 22B below, in accordance with an embodiment of the present invention.

It is to be understood that approaches described in the above additional aspects of silica shelling considerations may be used independently or in combination with one another. In one preferred embodiment, the resulting silica-shelled structures can be described as a slightly elongated sphere having dimensions of approximately 45 nm×40 nm. In one such embodiment, the quantum dot housed therein has dimensions of approximately 25 nm×7 nm, respectively. In an embodiment, a preferred additive layer thickness is at least 10 nm of silica on each end of the quantum dot, and at least 15 nm of silica on each side of the quantum dot. In a general embodiment, a silica shell thickness ranging from 5 nm to 20 nm surrounds the quantum dot additional silica.

In another aspect, upon shelling of individual nanocrystals with an insulator coating such as silica to provide discrete shelled nanocrystals, a network of nanocrystals may be formed by fusing together the insulator shells of a plurality of shelled nanocrystals. For example, in accordance with an embodiment of the present invention, insulator coatings of discrete passivated nanocrystals are fused together to form a substantially rigid network of quantum dots where each quantum dot is isolated from other quantum dots in the network by the fused insulator coating. In one such embodiment, fusing together the insulator shells of discretely passivated quantum dots into a fused network provides improved optical and reliability performance of the resulting structure as compared with the starting discretely passivated quantum dots. In one such embodiment, a chemical base is used to improve the optical performance of silica shell materials by enabling the fusing of the insulator coatings surrounding a plurality of quantum dots. In a specific embodiment, the insulator coatings is a silica coating and a base such as potassium hydroxide (KOH) is used to fuse together the silica coatings of a plurality of individually and discretely coated quantum dots. The result is a substantially rigid silica-based network of quantum dots. As described in greater detail below, and in association with the experimental sections, the amount of base material is scaled with the amount of silica in the reaction. In general, the approaches described herein have important applications for improving the optical and reliability performance of quantum dots or even other phosphor materials having an insulator coating and which are embedded in a matrix. In one such embodiment, the quantum dots or other phosphor materials are first individually shelled and then the shells are fused to form an insulator network which can be embedded in a matrix. In other embodiments, the insulator network is formed directly on the quantum dots or other phosphor materials.

In an embodiment, then, with respect to using colloidal semiconductor nanocrystals, also known as quantum dots, as downshifting fluorescent materials for LED lighting and/or display technologies, quantum dots are individually coated with a silica shell. The presence of the silica shell improves the performance of the quantum dots when they are subsequently embedded in a polymer film and subjected to various stress tests. Applications include LED lighting applications and/or display configurations. The use of base (such as KOH, NaOH or other similar materials) provides a fused network of the silica shells to improve the optical performance of silica shell materials. As described below, in particular embodiments, the scaling of the amount of KOH or other base with silica content is balanced to achieve optimal performance of the shelled/fused quantum dots.

Figures 19, 20:
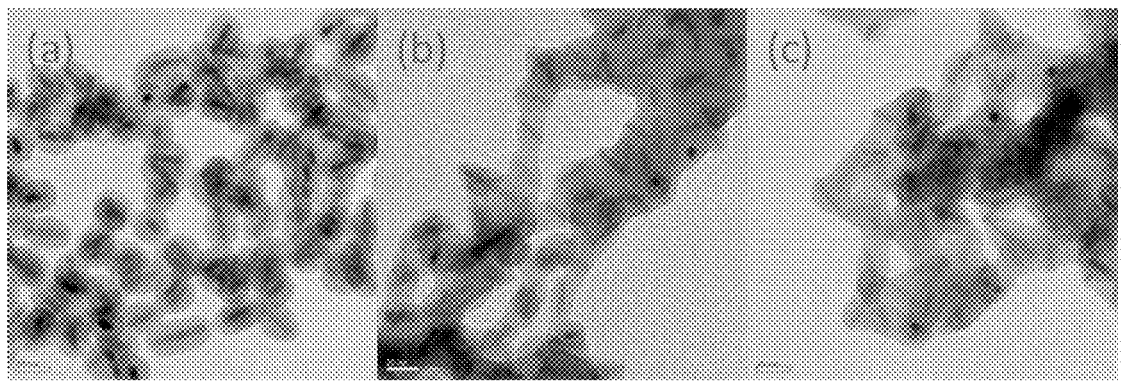
FIG. 19 is a Table demonstrating improved PLQY with the addition of base, in accordance with an embodiment of the present invention.
FIG. 20 includes transmission electron microscope images of KOH induced silica networking where (a) shows individually silica shelled quantum dots before the addition of KOH, (b) shows particles from the same batch after being treated with KOH, and (c) shows another view of silica shelled particles several days after being treated with KOH, in accordance with an embodiment of the present invention.

In an embodiment, the above described use of a base has been found to further boost the performance of silica shelled quantum dot materials, as measured by photoluminescence quantum yield PLQY. For example, in one embodiment, when measuring the PLQY at 120 degrees Celsius, quantum dots coated with silica shells which have been further treated with base show dramatic improvements in PLQY. FIG. 19 is a Table 1900 demonstrating improved PLQY with the addition of base, in accordance with an embodiment of the present invention.

It is to be understood that the results demonstrated in Table 1900 hold for many different variations to the silica shell layer and has been verified for a variety of conditions. The base material used is typically (but not limited to) potassium hydroxide (KOH), sodium hydroxide (NaOH), or other caustic salts. Other suitable bases may be used in place of, or in addition to, KOH or NaOH. For example, other such bases include, but are not limited to, LiOH, RbOH, CsOH, MgOH, Ca(OH)$_2$, Sr(OH)$_2$, Ba(OH)$_2$, (Me)$_4$NOH, (Et)$_4$NOH, and (Bu)$_4$NOH. These bases may be used individually or in combination with one another. It is best understood that by adding base in the correct proportion to the amount of silica shell material present in a reaction mixture, the resulting increased pH of the reaction mixture causes a redistribution of silica material such that silica networks are formed where quantum dot particles are encapsulated within the network, an example of which is described below in association with FIG. 20. The role of the resulting silica (or other insulating) network can include, but is not limited to: (1) the resulting fused network acts as a physical barrier to prevent unwanted chemical agents (such as oxygen) from reaching the quantum dot surface, and/or (2) the resulting fused network can act to immobilize the quantum dots to prevent further aggregation upon further processing, thus acting as a spacer to physically maintain a separation for each quantum dot within the network. As such, the role of the added base, then, can be to provide greater per-particle average silica coverage, while also serving to densify and strengthen the silica barrier.

As an example, FIG. 20 includes transmission electron microscope images 2000A-2000C of KOH induced silica networking where (a) shows individually silica shelled quantum dots before the addition of KOH, (b) shows particles from the same batch after being treated with KOH, and (c) shows another view of silica shelled particles several days after being treated with KOH, in accordance with an embodiment of the present invention. Referring to image 2000A discrete and individually shelled quantum dots are shown, with the quantum dots imaged darker than the surrounding shells. Referring to images 2000B and 2000C, networks of shells based on fused silica coatings are shown, with the quantum dots maintaining shelling or coating individuality from one another, but the shelling or coating fused into a rigid network.

In a particular embodiment, an optimal starting point for the above described fusing process is with quantum dot particles that have individually been coated with a silica layer, e.g., typically through a reverse-micelle reaction involving tetraethylorthosilicate (TEOS) or other similar silica precursor. The resulting discrete shells then incorporated into the final fused network, while maintaining spatial separation between each quantum dot. However, silica shelled quantum dot particles fabricated from other processes such as the Stober method also benefit from improvements in performance upon the addition of base to fuse the individual shells. In general, regardless of the approach used to fabricate the discrete shelled quantum dots, in another embodiment, the addition of extra free silica to individually silica-coated quantum dots in the presence of sufficient KOH further improves performance of the quantum dots. Additional silica may be added in any number of ways including, but not limited to, the addition of Ludox, the addition of silica nano-powder, through the addition of silica nano-particles formed by means of TEOS (or similar reactions) or Stober methods, and even direct addition of orthosilicate compounds such as TEOS, TMOS, TBOS and like precursors.

As mentioned briefly above, in a particular embodiment, in order to realize the greatest increase in performance, such a quantum dot PLQY performance, a particular stoichiometric ratio between moles of silica present in the reaction (e.g., as coatings for discretely shelled quantum dots) and moles of base is maintained at a constant. In one such embodiment, the optimal ratio of moles KOH to moles silica content is 1:2. Adding less base than prescribed by this ratio can lead to decreases in performance compared to adding the optimal amount. In a specific embodiment, quantum dot particles coated in a silica shell on the order of approximately 25 nanometer shell thickness is used as a starting point for ultimate shell fusing. In an exemplary embodiment, KOH is added to such particles in proportion to the amount of silica present at a ratio of 1 mole KOH for every 2 moles of silica present. Exemplary synthetic procedures are provided in the Experimental section as Example 23 (in place reaction) and Example 24A (pre-treatment).

In an embodiment, as described in example 24B, a heat treatment is also involved. In one such embodiment, high performance is achieved from a given shell batch having thick TEOS-based shells, spinning down to remove excess solvent, addition of extra silica nanopowder smaller in diameter than the silica shelled quantum dots with corresponding levels of KOH, mixing, and heating with occasional mixing. The diameter of the added silica may be important in that it undergoes a "ripening" type process where silica is added to the particles with the lower radius of curvature.

Figure 21:
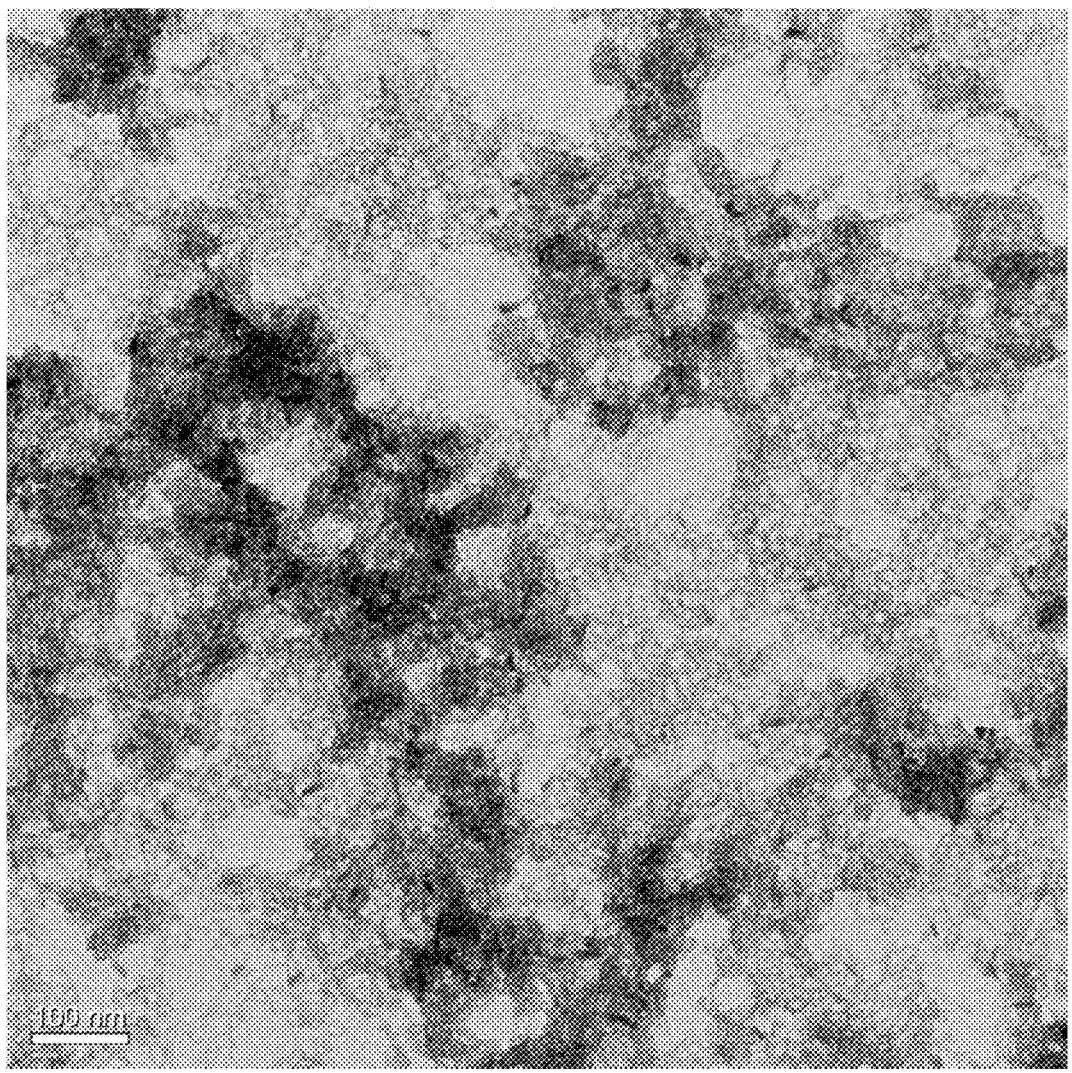
FIG. 21 is a transmission electron microscope image of the resulting silica fusing product from experimental example 25, in accordance with an embodiment of the present invention.

It is to be understood that other approaches may be used to ultimately fabricate a network of silica to protect a nanocrystalline shell and anisotropic nanocrystalline core pairing from the environment. For example, in another embodiment, a silica gel network is formed using a direct micelle sol-gel reaction. In one such embodiment, using the direct micelle sol-gel reaction includes dissolving a nanocrystalline shell/nanocrystalline core pairing in a first non-polar solvent to form a first solution. Subsequently, the first solution is added along with a species such as, but not limited to, 3-aminopropyltrimethoxysilane (APTMS), 3-mercapto-trimethoxysilane, or a silane comprising a phosphonic acid or carboxylic acid functional group, to a second solution having a surfactant dissolved in water. Subsequently, a suitable catalyst and tetraethylorthosilicate (TEOS) are added to the second solution. In another embodiment, the first solution is added alone to a second solution having a surfactant dissolved in water. Subsequently, a suitable catalyst and tetraethylorthosilicate (TEOS) are added to the second solution. Exemplary synthetic procedures are provided in the Experimental section as Examples 25-27. FIG. 21 is a transmission electron microscope image 2100 of the resulting silica fusing product from experimental example 25, in accordance with an embodiment of the present invention.

In accordance with an embodiment of the present invention, the above described insulator network fabrication approaches address issues where downconversion materials such as quantum dots are not able to withstand harsh environments such as high temperatures, high flux, and high humidity environments. The addition of silica, especially when treated with a base, allows these materials to continue functioning as designed even when operating in harsh environments. In one such embodiment, phosphor materials, such as quantum dots, are coated in silica shells in conjunction with a base that serves to form silica networks with phosphors embedded therein. The resulting insulator networks can be used to spatially separate quantum dots on an individual basis. Once separated by the silica networks cross-talk between quantum dots may be avoided since the quantum dots are coated discretely (i.e., each maintains an entirely encapsulating coating even upon network formation) and/or their positioning relative to one another becomes substantially fixed.

In another aspect, quantum dot composite compositions are described. For example, the quantum dots (including coated quantum dots or a network of quantum dots sharing a fused insulator coating) described above may be embedded in a matrix material to make a composite using a plastic or other material as the matrix. In an embodiment, composite compositions including matrix materials and silica coated core/shell quantum dots having photoluminescence quantum yields between 90 and 100% are formed. Such quantum dots may be incorporated into a matrix material suitable for down conversion in LED applications.

Composites formed by conventional approaches typically suffer from non-uniform dispersion of quantum dots throughout the matrix material which can result in particle agglomeration. Agglomeration may be so severe as to result in emission quenching reducing light output. Another problem is lack of compatibility between the quantum dots and the matrix reduces composite performance. Lack of materials compatibility may introduce a discontinuity at the polymer/quantum dot interface where composite failure may initiate when it is deployed in ordinary use. Also, there is a possibility of a lack of materials compatibility with other phosphor material. Aggregates can lead to difficulties in achieving desired light output levels (and consequently color points) as the light output level as calculated for a given amount of active material depends on how the active material is dispersed. "Shadowing" or "shielding" effects caused by aggregation may lead to a need for an increase in active material to achieve the same light output as a sample exhibiting limited or no aggregation.

Accordingly, there remains a need for a composite material having a quantum dot composition in a matrix that is strong, resistant to thermal degradation, resistant to chemical degradation, provides good adhesion between the coated quantum dot and coupling agent and provides good adhesion between the coupling agent and the polymer matrix. Embodiments described below include quantum dots incorporated into composite matrixes to produce high refractive index films having a high PLQY suitable for solid state device lighting including light emitting diodes.

In an embodiment, an approach for incorporating quantum dots or a network of quantum dots sharing a fused insulator coating into matrix materials includes reacting a silica shell or fused network coating with a silane coupling agent having two reactive functionalities under the proper conditions. Such an arrangement drives a condensation reaction, binding one end of the silane to the silica surface and leaving the other end of the molecule exposed for integration into a matrix. Other approaches include using a curable material such as metal oxide nanocrystals in a matrix material. In the curable material, metal oxide nanocrystals are linked to a polymer matrix via titanate or a zirconate coupling agents as well as a silane coupling agent, where the metal atoms of the coupling agent link to the oxygen atoms of the metal oxide nanocrystals. Since metal oxides generally do not have a higher refractive index, the curable material incorporating the metal oxide nanocrystals typically cannot achieve a refractive index sufficient to improve the light extraction efficiency of photons emitted by an LED in a solid-state device. A high refractive index material including zinc sulfide (ZnS) in a matrix material is another approach attempted. In making the high refractive index material, ZnS colloids are synthesized with ligands having hydroxyl functional groups that are linked to isocyanate function groups present on an oligomer backbone in the matrix material.

In a general embodiment, a composite includes a matrix material. A plurality of semiconductor structures (e.g., quantum dot structures having a coated or non-coated core/shell pairing, such as the structures described above, or a network of quantum dots sharing a fused insulator coating) is embedded in the matrix material. In an embodiment, a lighting apparatus includes a light emitting diode and a composite coating the light emitting diode. The composite may be formed by embedding quantum dots in a matrix material described below.

Figure 9A:
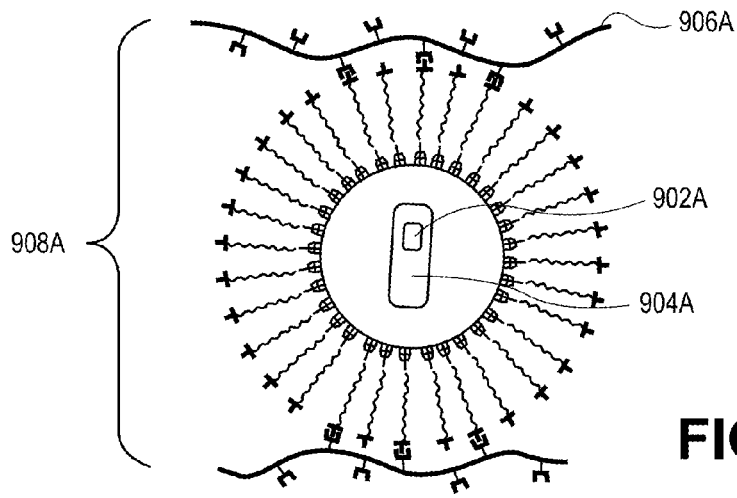
FIGS. 9A-9C illustrate schematic representations of possible composite compositions for quantum dot integration, in accordance with an embodiment of the present invention.
Figure 9B:
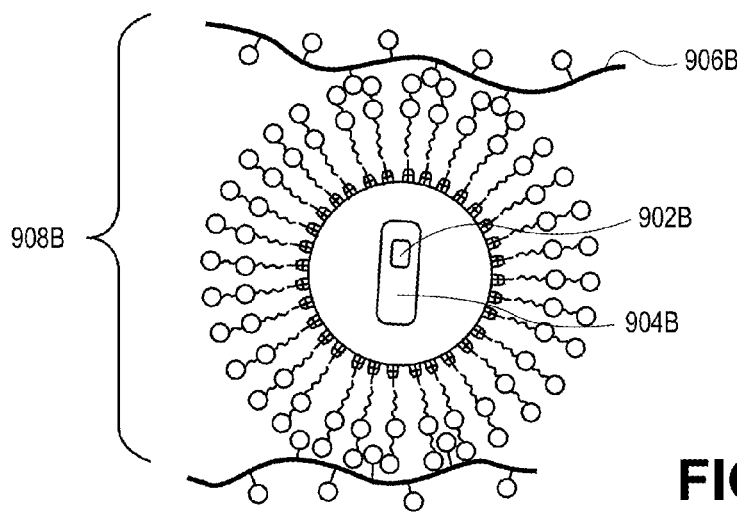
Figure 9C:
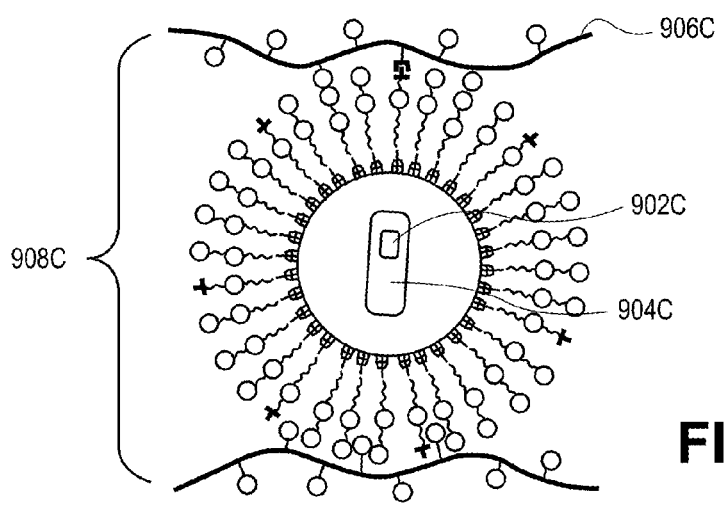

With reference to the above described composite, in an embodiment, each of the plurality of semiconductor structures is cross-linked with, polarity bound by, or tethered to the matrix material. In an embodiment, each of the plurality of semiconductor structures is bound to the matrix material by a covalent, dative, or ionic bond. By way of example, FIGS. 9A-9C illustrate schematic representations of possible composite compositions for quantum dot integration, in accordance with an embodiment of the present invention. Referring to FIG. 9A, a nanocrystalline core 902A and shell 904A pairing is incorporated into a polymer matrix 906A by active cross-linking through multiple and interchain binding to form a cross-linked composition 908A. Referring to FIG. 9B, a nanocrystalline core 902B and shell 904B pairing is incorporated into a polymer matrix 906B by polarity-based chemical similarity and dissolution to form a polarity based composition 908B. Referring to FIG. 9C, a nanocrystalline core 902C and shell 904C pairing is incorporated into a polymer matrix 906C by reactive tethering by sparse binding and chemical similarity to form a reactive tethering based composition 908C. A similar approach may be used to incorporate a network of quantum dots sharing a fused insulator coating into a matrix.

With reference again to the above described composite, in an embodiment, one or more of the semiconductor structures further includes a coupling agent covalently bonded to an outer surface of the insulator layer. For example, in one such embodiment, the insulator layer includes or is a layer of silica ($SiO_x$), and the coupling agent is a silane coupling agent, e.g., having the formula $X_nSiY_{4-n}$, where X is a functional group capable of bonding with the matrix material and is one such as, but not limited to, hydroxyl, alkoxy, isocyanate, carboxyl, epoxy, amine, urea, vinyl, amide, aminoplast and silane, Y is a functional group such as, but not limited to, hydroxyl, phenoxy, alkoxy, hydroxyl ether, silane or aminoplast, and n is 1, 2 or 3. In another embodiment, however, the coupling agent is one such as, but not limited to, a titanate coupling agent or a zirconate coupling agent. It is to be understood that the terms capping agent, capping ligand, ligand and coupling agent may be used interchangeably as described above and, generally, may include an atom, molecule or other chemical entity or moiety attached to or capable of being attached to a nanoparticle. Attachment may be by dative bonding, covalent bonding, ionic bonding, Van der Waals forces or other force or bond.

In the case that a silica surface of a silica coated quantum dot is modified using silane coupling agents having multiple functional moieties, coupling to the surface of the silica shell and coupling to a matrix material and/or other matrix additives may be enabled. Such an approach provides dispersed uniformly throughout the composite matrix using as little effort (e.g., reaction energy) as possible. Stronger physical and/or chemical bonding between the silica coated quantum dots and the matrix resin occurs. Also, the silane coupling composition must be compatible with both the silica coated quantum dot, which is inorganic, and the polymer matrix, which may be organic. Without being bound by any particular theory or principle, it is believed that the silane coupling agent forms a bridge between the silica and the matrix resin when reactive functional groups on the silane coupling agent interact with functional groups on the surface of the silica and/or the matrix resin. Since the functional groups involved are typically polar in nature, the coupling agent tends to be hydrophilic and readily dispersed in an aqueous size composition.

Matrix materials suitable for embodiments of the present invention may satisfy the following criteria: they may be optically clear having transmission in the 400-700 nm range of greater than 90%, as measured in a UV-Vis spectrometer. They may have a high refractive index between about 1.0 and 2.0, preferably above 1.4 in the 400-700 nm range. They may have good adhesion to an LED surface if required and/or are sufficiently rigid for self-supporting applications. They may able to maintain their properties over a large temperature range, for example −40° C. to 150° C. and over a long period of time (over 50,000 hours at a light intensity typically 1-10 w/cm2 of 450 nm blue light).

Thus, with reference again to the above described composite, in an embodiment, the insulator layer is composed of a layer of silica ($SiO_x$), and the matrix material is composed of a siloxane copolymer. In another embodiment, the matrix material has a UV-Vis spectroscopy transmission of greater than 90% for light in the range of 400-700 nanometers. In an embodiment, the matrix material has a refractive index approximately in the range of 1-2 for light in the range of 400-700 nanometers. In an embodiment, the matrix material is thermally stable in a temperature range of −40-250 degrees Celsius. In an embodiment, the matrix material is composed of a polymer such as, but not limited to, polypropylene, polyethylene, polyesters, polyacetals, polyamides, polyacrylamides, polyimides, polyethers, polyvinylethers, polystyrenes, polyoxides, polycarbonates, polysiloxanes, polysulfones, polyanhydrides, polyamines, epoxies, polyacrylics, polyvinylesters, polyurethane, maleic resins, urea resins, melamine resins, phenol resins, furan resins, polymer blends, polymer alloys, or mixtures thereof. In one such embodiment, the matrix material is composed of a polysiloxane such as, but not limited to, polydimethylsiloxane (PDMS), polymethylphenylsiloxane, polydiphenylsiloxane and polydiethylsiloxane. In an embodiment, the matrix material is composed of a siloxane such as, but not limited to, dimethylsiloxane or methylhydrogen siloxane.

Additionally, with reference again to the above described composite, in an embodiment, the plurality of semiconductor structures is embedded homogeneously in the matrix material. In an embodiment, the composite further includes a compounding agent embedded in the matrix material. The compounding agent is one such as, but not limited to, an antioxidant, a pigment, a dye, an antistatic agent, a filler, a flame retardant, an ultra-violet (UV) stabilizer, or an impact modifier. In another embodiment, the composite further includes a catalyst embedded in the matrix material, the catalyst one such as, but not limited to, a thiol catalyst or a platinum (Pt) catalyst.

Accordingly, in an embodiment, a method of fabrication includes forming a plurality of semiconductor structures or a network of semiconductor structures sharing a fused insulator coating embedded the semiconductor structures in a matrix material (or embedding preformed semiconductor structures in a matrix material). In one such embodiment, embedding the plurality of semiconductor structures in the matrix material includes cross-linking, reactive tethering, or ionic bonding the plurality of semiconductor structures with the matrix material. In an embodiment, the method further includes surface-functionalizing an insulator layer for the semiconductor structures prior to embedding the plurality of semiconductor structures in the matrix material. In one such embodiment, the surface-functionalizing includes treating the insulator layer with a silane coupling agent. However, in an alternative embodiment, coated semiconductor structures are embedded in a matrix by using a ligand-free insulator layer.

In another embodiment, simple substitution at the surface of the silica coated quantum dots is effective for stable integration without undesired additional viscosity and is suitable to produce a low-viscosity product such as a silicone gel. In one embodiment of the present invention a composite incorporates quantum dots which crosslink with the matrix through silane groups and which possess an adequate number of silane groups in order to form an elastic network. In addition, adequate adhesion to various substrates is enabled. Furthermore, silicone-based matrixes may be used. A structure of such polymers may be obtained which form microstructures in the crosslinked composition, thereby yielding cross-linked polymer compounds with an excellent mechanical strength. Furthermore, because of the distribution of the reactive silane groups, a high elasticity may be obtained after cross-linking.

Figure 22:
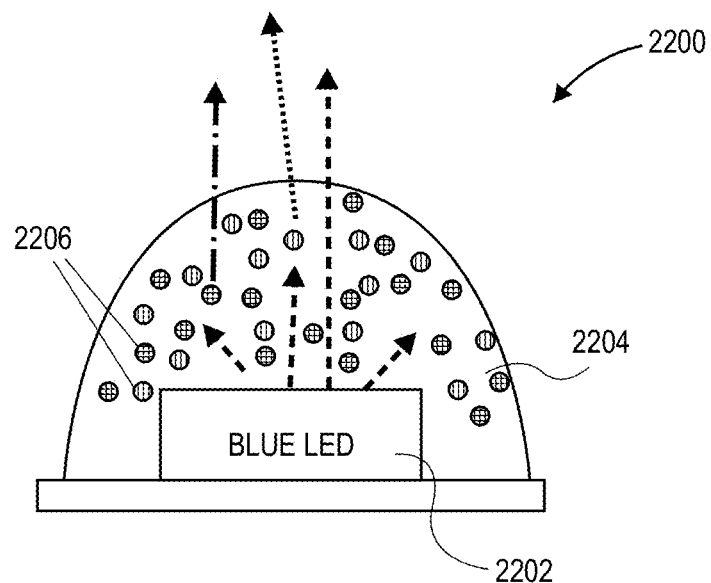
FIG. 22 illustrates a lighting device that includes a blue LED with a layer having a composition with a dispersion of quantum dots or a network of quantum dots sharing a fused insulator coating therein, in accordance with an embodiment of the present invention.

With respect to illustrating the above concepts in a resulting device configuration, FIG. 22 illustrates a lighting device 2200. Device 2200 has a blue LED 2202 with a layer 2204 having a dispersion of quantum dots 2206 or a network of quantum dots sharing a fused insulator coating therein, in accordance with an embodiment of the present invention. Devices such as 2200 may be used to produce "cold" or "warm" white light. In one embodiment, the device 2200 has little to no wasted energy since there is little to no emission in the IR regime. In a specific such embodiment, the use of a layer having a composition with a dispersion of quantum dots, including silica coated quantum dots or a network of quantum dots sharing a fused insulator coating, such as those described herein enables greater than approximately 40% lm/W gains versus the use of conventional phosphors. Increased efficacy may thus be achieved, meaning increased luminous efficacy based on lumens (perceived light brightness) per watt electrical power. Accordingly, down converter efficiency and spectral overlap may be improved with the use of a dispersion of quantum dots to achieve efficiency gains in lighting and display. In an additional embodiment, a conventional phosphor is also included in the composition, along with the dispersion of quantum dots 2206 or a network of quantum dots sharing a fused insulator coating.

Figure 23:
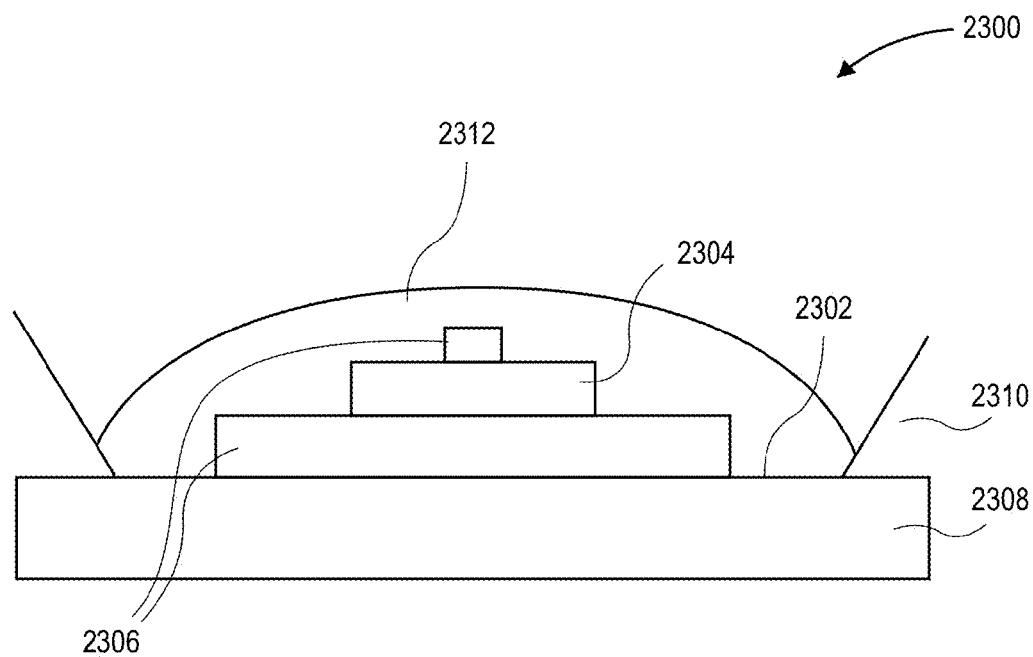
FIG. 23 illustrates a cross-sectional view of a lighting device with a layer having a composition with a dispersion of quantum dots or a network of quantum dots sharing a fused insulator coating therein, in accordance with an embodiment of the present invention.

Different approaches may be used to provide a quantum dot layer in a lighting device. In an example, FIG. 23 illustrates a cross-sectional view of a lighting device 2300 with a layer having a composition with a dispersion of quantum dots or a network of quantum dots sharing a fused insulator coating therein, in accordance with an embodiment of the present invention. Referring to FIG. 23, a blue LED structure 2302 includes a die 2304, such as an InGaN die, and electrodes 2306. The blue LED structure 2302 is disposed on a coating or supporting surface 2308 and housed within a protective and/or reflective structure 2310. A layer 2312 is formed over the blue LED structure 2302 and within the protective and/or reflective structure 2310. The layer 2312 has a composition including a dispersion of quantum dots, or a network of quantum dots sharing a fused insulator coating, or a combination of such quantum dots and conventional phosphors. Although not depicted, the protective and/or reflective structure 2310 can be extended upwards, well above the matrix layer 2312, to provide a "cup" configuration.

Figure 24:
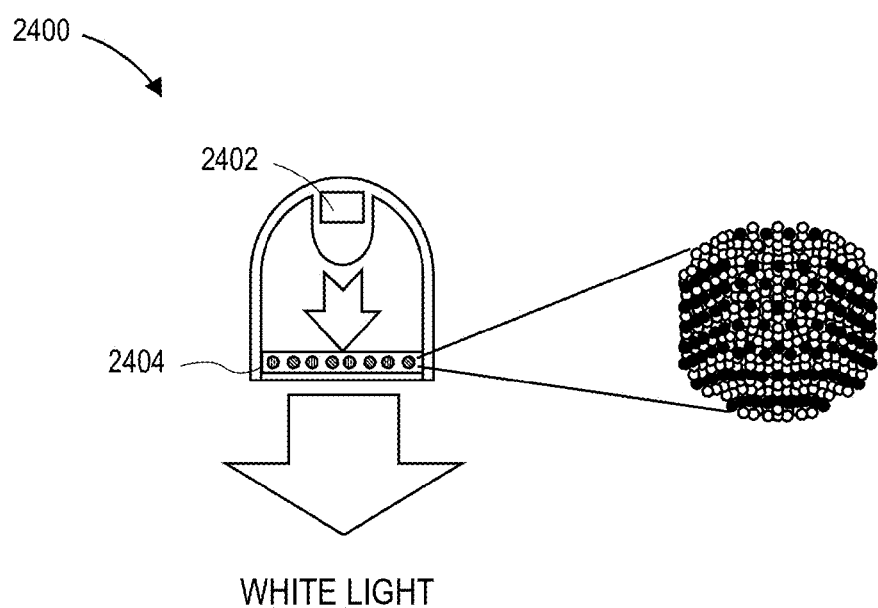
FIG. 24 illustrates a cross-sectional view of a lighting device with a layer having a composition with a dispersion of quantum dots or a network of quantum dots sharing a fused insulator coating therein, in accordance with another embodiment of the present invention.

In another example, FIG. 24 illustrates a cross-sectional view of a lighting device 2400 with a layer having a composition with a dispersion of quantum dots or a network of quantum dots sharing a fused insulator coating therein, in accordance with another embodiment of the present invention. Referring to FIG. 24, the lighting device 2400 includes a blue LED structure 2402. A quantum dot down converter screen 2404 is positioned somewhat remotely from the blue LED structure 2402. The quantum dot down converter screen 2404 includes a layer with a composition having a dispersion of quantum dots or a network of quantum dots sharing a fused insulator coating therein, e.g., of varying color, or a combination of such quantum dots and conventional phosphors. In one embodiment, the device 2400 can be used to generate white light, as depicted in FIG. 24.

Figure 25:
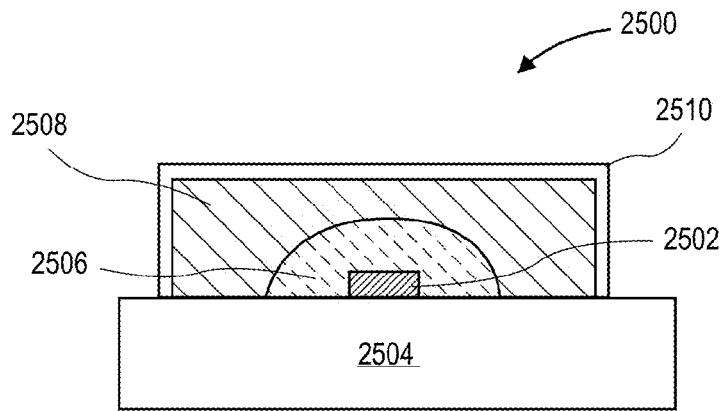
FIG. 25 illustrates a cross-sectional view of a lighting device with a layer having a composition with a dispersion of quantum dots or a network of quantum dots sharing a fused insulator coating therein, in accordance with another embodiment of the present invention.

In another example, FIG. 25 illustrates a cross-sectional view of a lighting device 2500 with a layer having a composition with a dispersion of quantum dots or a network of quantum dots sharing a fused insulator coating therein, in accordance with another embodiment of the present invention. Referring to FIG. 25, the lighting device 2500 includes a blue LED structure 2502 supported on a substrate 2504 which may house a portion of the electrical components of the blue LED structure 2502. A first conversion layer 2506 has a composition that includes a dispersion or network of red-light emitting quantum dots therein. A second conversion layer 2508 has a second composition that includes a dispersion or network of quantum dots or green or yellow phosphors or a combination thereof (e.g., yttrium aluminum garnet, YAG phosphors) therein. Optionally, a sealing layer 2510 may be formed over the second conversion layer 2508, as depicted in FIG. 25. In one embodiment, the device 2500 can be used to generate white light.

Figure 26:
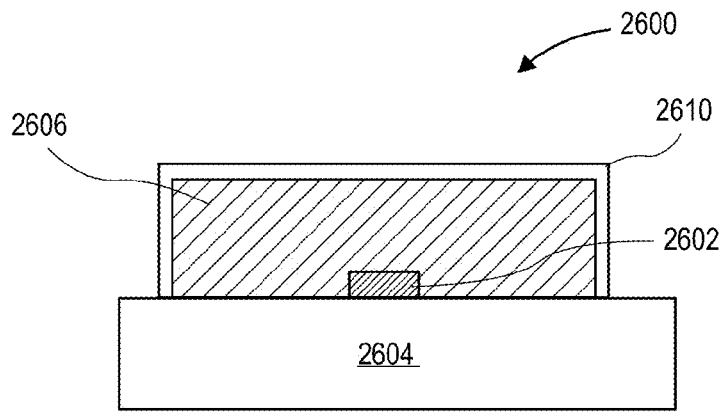
FIG. 26 illustrates a cross-sectional view of a lighting device with a layer having a composition with a dispersion of quantum dots or a network of quantum dots sharing a fused insulator coating therein, in accordance with another embodiment of the present invention.

In another example, FIG. 26 illustrates a cross-sectional view of a lighting device 2600 with a layer having a composition with a dispersion of quantum dots or a network of quantum dots sharing a fused insulator coating therein, in accordance with another embodiment of the present invention. Referring to FIG. 26, the lighting device 2600 includes a blue LED structure 2602 supported on a substrate 2604 which may house a portion of the electrical components of the blue LED structure 2602. A single conversion layer 2606 has a composition that includes a dispersion or network of red-light emitting quantum dots in combination with a dispersion or network of green quantum dots or green and/or yellow phosphors therein. Optionally, a sealing layer 2610 may be formed over the single conversion layer 2606, as depicted in FIG. 26. In one embodiment, the device 2600 can be used to generate white light.

Figure 27A:
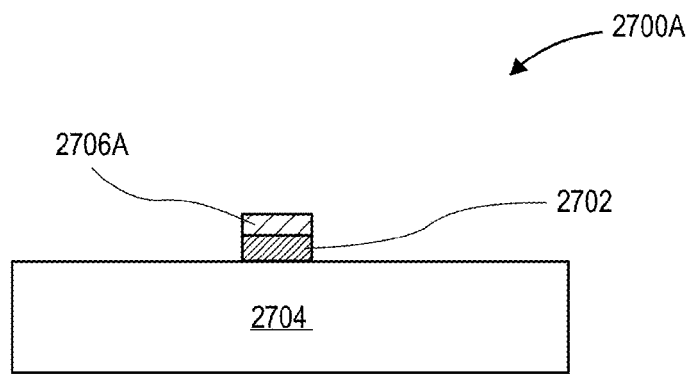
FIGS. 27A-27C illustrate cross-sectional views of various configurations for a lighting device with a layer having a composition with a dispersion of quantum dots or a network of quantum dots sharing a fused insulator coating therein, in accordance with another embodiment of the present invention.
Figure 27B:
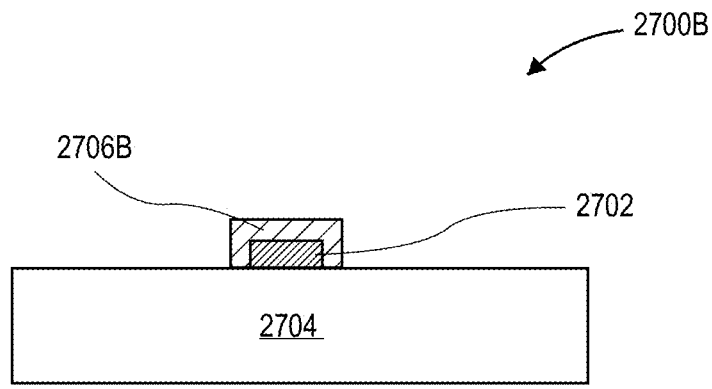
Figure 27C:
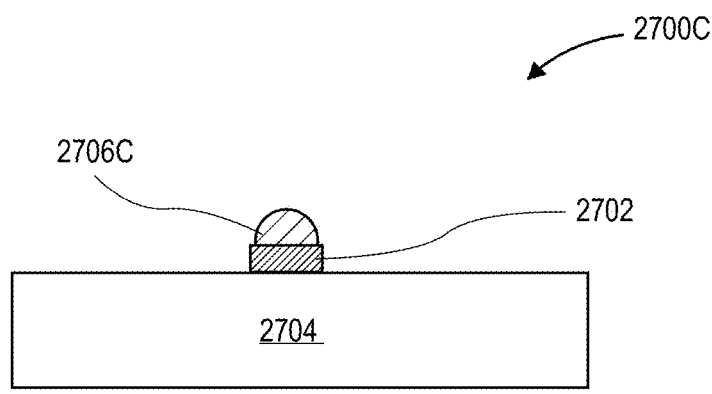

In additional examples, FIGS. 27A-27C illustrate cross-sectional views of various configurations for lighting devices 2700A-2700C with a layer having a composition with a dispersion of quantum dots or a network of quantum dots sharing a fused insulator coating therein, respectively, in accordance with another embodiment of the present invention. Referring to FIGS. 27A-27C, the lighting devices 2700A-2700C each include a blue LED structure 2702 supported on a substrate 2704 which may house a portion of the electrical components of the blue LED structure 2702. A conversion layer 2706A-2706C, respectively, has a composition that includes a dispersion or network of one or more light-emitting color types of quantum dots therein. Referring to FIG. 2700A specifically, the conversion layer 2706A is disposed as a thin layer only on the top surface of the blue LED structure 2702. Referring to FIG. 2700B specifically, the conversion layer 2706B is disposed as a thin layer conformal with all exposed surfaces of the blue LED structure 2702. Referring to FIG. 2700C specifically, the conversion layer 2706C is disposed as a "bulb" only on the top surface of the blue LED structure 2702. In the above examples (e.g., FIGS. 22-26 and 27A-27C), although use with a blue LED is emphasized, it is to be understood that a layer having a composition with a dispersion of quantum dots or a network of quantum dots sharing a fused insulator coating therein can be used with other light sources as well, including LEDs other than blue LEDs.

EXEMPLARY SYNTHETIC PROCEDURES

Example 1

Synthesis of CdSe Core Nanocrystals 0.560 g (560 mg) of ODPA solid was added to a 3-neck 25 ml round-bottom flask and 6 g TOPO solid was added to the flask. 0.120 g (120 mg) of CdO solid was added to the flask. With the flask sealed and the reagents inside (CdO, ODPA, TOPO), heat the reaction to 120° C. under flowing UHP Argon gas. When the reaction mixture becomes liquid, begin stirring at 800 RPM to completely distribute the CdO and ODPA. When the temperature equilibrates at around 120° C., begin degassing the reaction mixture: Standard degas is for 30 minutes at as low a vacuum as the system can maintain, preferably between 10-30 torr. After the first degas, switch the reaction back to flowing UHP Argon gas. The temperature of the reaction was raised to 280° C. to dissociate the CdO. Dissociation is accompanied by a loss of the typical red color for CdO. After dissociation of the CdO, cool the reaction to 120° C. for the 2nd degassing step. Preferably this step is done slowly. In one embodiment this is done in increments of 40 degrees and allowed to equilibrate at each step. When the reaction mixture has cooled to about 120° C., begin the second degassing step. The second degassing is typically 1 hour at the lowest vacuum level possible. After the second degassing, switch the reaction back to flowing UHP Argon. Heat the reaction mixture. Inject 3.0 g TOP into the reaction solution as temperature increases above 280° C. Equilibrate the reaction solution at 370° C. When the reaction is equilibrated at 370° C., inject 0.836 g of 14% Se:TOP stock solution into the solution. The reaction is run until the desired visible emission from the core is achieved. For CdSe cores the time is usually between 0.5 and 10 minutes. To stop the reaction: while continuing to stir and flow UHP Argon through the reaction, rapidly cool the solution by blowing nitrogen on the outside of the flask. When the reaction temperature is around 80° C., expose the reaction solution to air and inject approximately 6 mL of toluene. Precipitate the CdSe nanocrystals through the addition of 2-propanol (IPA) to the reaction solutions. Preferably the mixture should be approximately 50/50 (by volume) reaction solution/IPA to achieve the desired precipitation. Centrifuge for 5 minutes at 6000 RPM. Redissolve the CdSe in as little toluene as possible solid (<2 mL). Precipitate the CdSe again using IPA. Centrifuge. Decant the supernatant liquid. Dissolve the CdSe solid in anhydrous toluene.

Example 2

Synthesis of CdSe/CdS Core-Shell Nanocrystal Heterostructures Having PLQY>90%

Transfer 0.290 g (290 mg) of ODPA into a round bottom flask. Transfer 0.080 g (80 mg) of hexylphosphonic acid (HPA) into the flask. Transfer 3 g TOPO into the flask. Transfer 0.090 g (90 mg) of CdO solid into the reaction flask. With the flask sealed and the reagents inside (CdO, ODPA, TOPO, HPA), heat the reaction to 120° C. under flowing UHP Argon gas. When the reaction mixture becomes liquid, at about 60° C., begin stirring at 800 RPM to completely distribute the CdO, ODPA, and HPA. When the temperature settles at 120° C., begin degassing the reaction mixture. After the degas step, switch the reaction back to flowing UHP Argon gas. Raise the temperature of the reaction to 280° C. to dissociate the CdO. Increase the temperature set-point of the reaction to 320° C. Inject 1.5 g TOP into the reaction solution as temperature increases above 280° C. When the reaction is equilibrated at 320° C., inject a mixture of 1.447 g of 7.4% S:TOP stock solution and 0.235 g concentration-adjusted CdSe seed stock into the reaction solution. Immediately reduce the set point of the temperature controller to 300° C. Allow the reaction to proceed for the requisite time to necessary to produce the desired length and width of shell, yielding a rod having an aspect ratio as between 1.5 and 10, more preferably between 3 and 6. Reaction temperature for shell growth is between 120° C. and 380° C., preferably between 260° C. and 320° C., more preferably between 290° C. and 300° C.

The reaction is monitored by testing a sample to determine the absorbance at 400 nm and the at the CdSe exciton peak. Most preferably the reaction is stopped when the absorbance at 400 nm divided by the absorbance at the CdSe exciton peak is between about 25-30, but the invention contemplates that the absorbance ratio may be between about 6 and about 100, preferably between about 15-35. By "stopping the growth" it is meant that any method steps may be employed known in the art if desired and available to cease the growth of the shell. Some methods will lead to quicker cessation of shell growth than others.

Absorbance measuring may be performed by UV-VIS spectroscopic analytical method, such as a method including flow injection analysis for continuous monitoring of the reaction. In an embodiment, the reaction is stopped or arrested by removing a heating mantle and allowing the reaction vessel to cool. When the reaction temperature is around approximately 80 degrees Celsius, the reaction solution is exposed to air and approximately 4-6 mL of toluene is injected. The quantum dots are purified by transferring the reaction solution into four small centrifuge tubes, so that an equal volume is in each tube. The QDH product is precipitated through the addition of 2-propanol (IPA) to the reaction solutions. Following centrifuging, the supernatant liquid is decanted. The QDH is redissolved in as little toluene as possible (e.g., less than approximately 2 mL) and re-concentrated into one centrifuge tube. The precipitation and centrifugation steps are repeated. The final solid product is then dissolved in approximately 2 g of toluene.

Example 3

Synthesis of CdSe/CdS Quantum Dot Having an Absorbance Ratio Between 6-100

Figure 10:
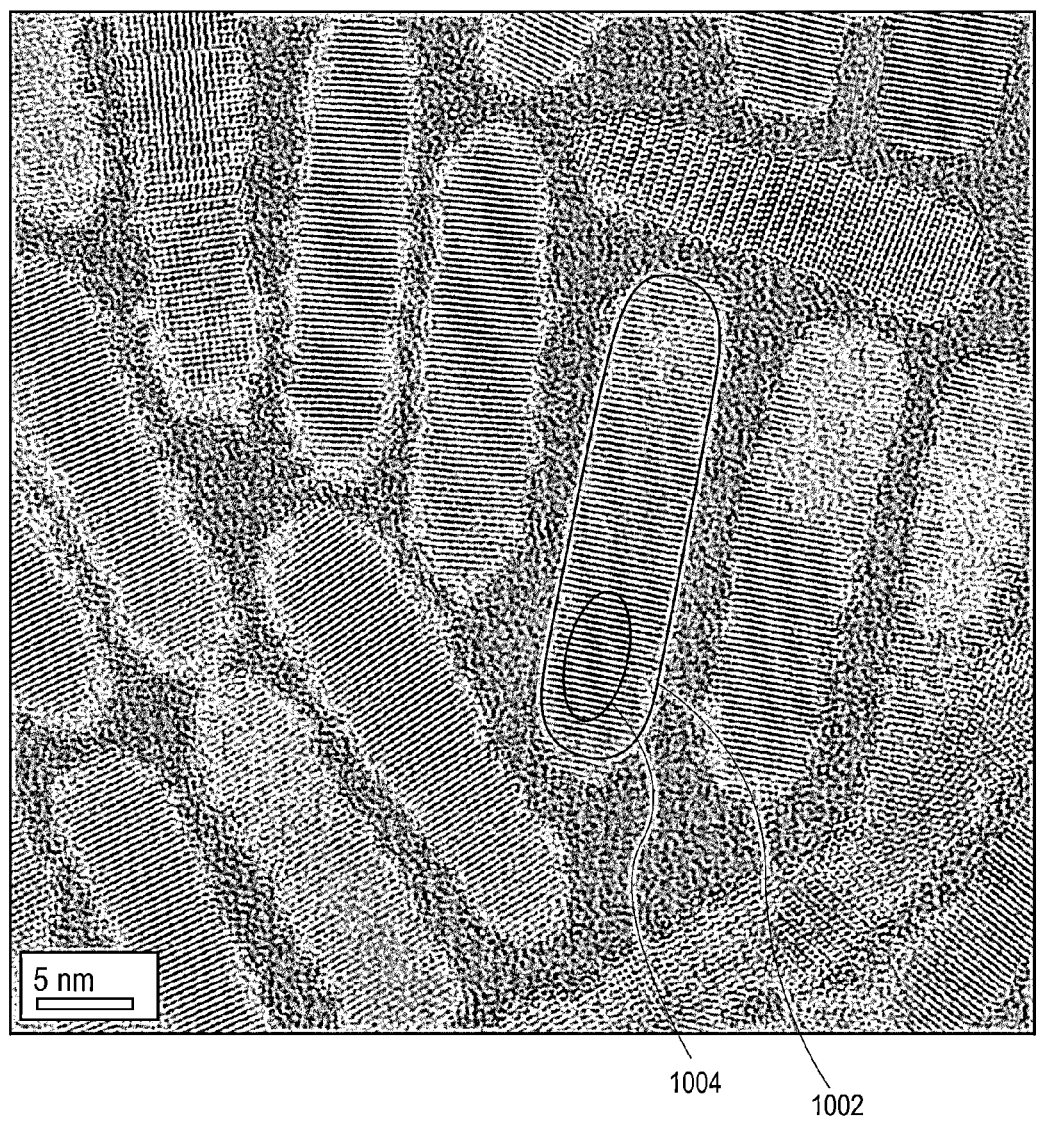
FIG. 10 is a transmission electron microscope (TEM) image of a sample of core/shell CdSe/CdS quantum dots, in accordance with an embodiment of the present invention.

A quantum dot was fabricated according to Example 2 and having an absorbance ratio between 6-100. FIG. 10 is a transmission electron microscope (TEM) image 1000 of a sample of core/shell (1002/1004) CdSe/CdS quantum dots, in accordance with an embodiment of the present invention. The TEM image 1000 indicates that there are substantially no structural defects as can be deduced from the low density of stacking faults and lack of other visible defects along the semiconductor structure 1002/1004.

Example 4

Synthesis of CdSe/CdS Red Quantum Dot with a PLQY=96%

Figure 11:
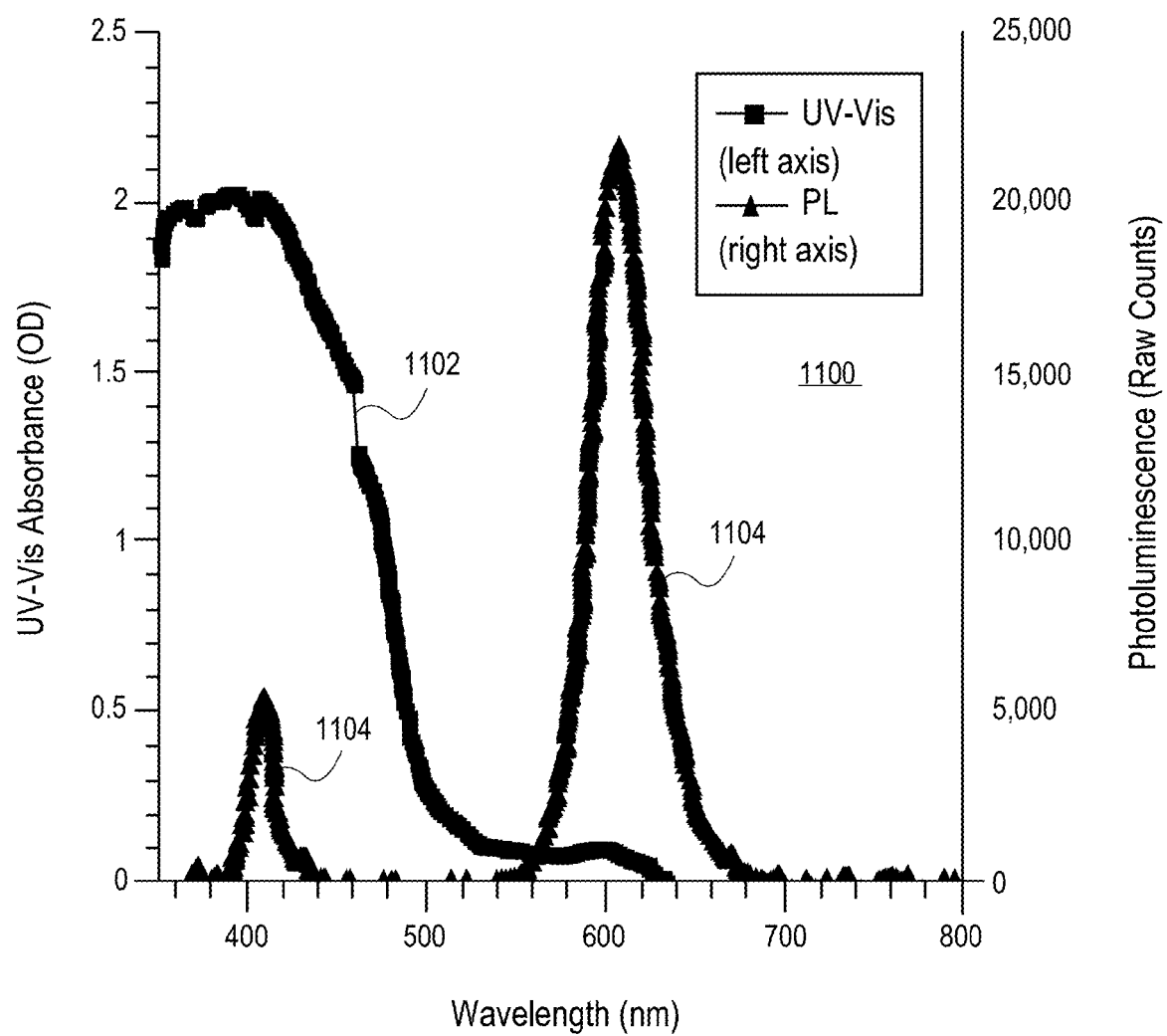
FIG. 11 is a plot including a UV-Vis absorbance spectrum and photoluminescent emission spectrum for a CdSe/CdS core/shell quantum dot having a PLQY of 96%, in accordance with an embodiment of the present invention.
Figure 12:
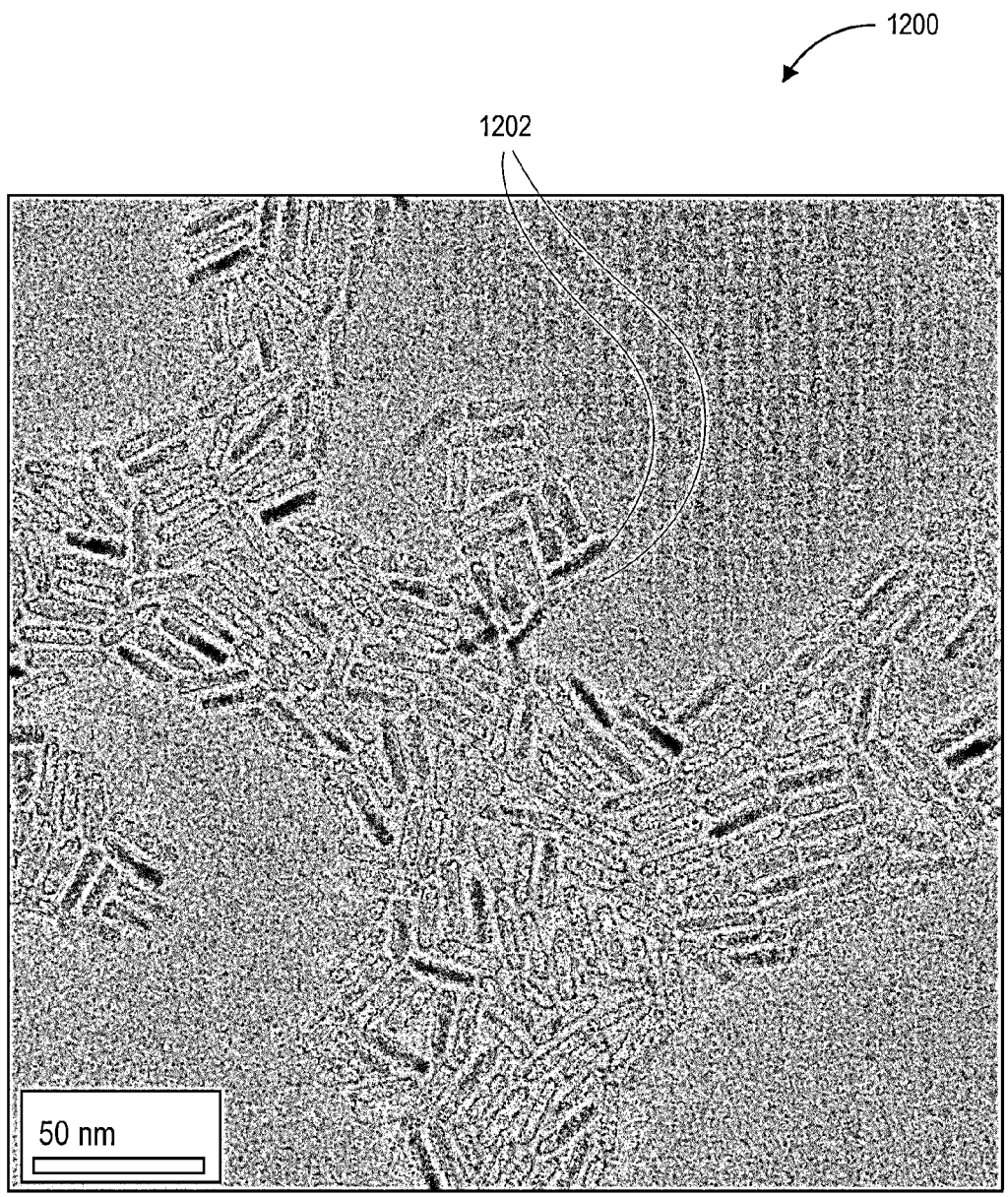
FIG. 12 is a transmission electron microscope (TEM) image of a sample of CdSe/CdS quantum dots having a PLQY of 96%, in accordance with an embodiment of the present invention.

Quantum dots were fabricated according to Example 2 and having an absorbance ratio between 6-100, and having a PLQY of 96% at 606 nm. The average length (from TEM data) is 22.3 nm±3.1 nm. The average width (from TEM data) is 6.0 nm±0.6 nm. The average aspect ratio (from TEM data) is 3.8±0.6. FIG. 11 is a plot 1100 including a UV-Vis absorbance spectrum 1102 and photoluminescent emission spectrum 1104 for a CdSe/CdS core/shell quantum dot having a PLQY of 96%, in accordance with an embodiment of the present invention. The quantum dot has essentially no overlapping absorption and emission bands. FIG. 12 is a transmission electron microscope (TEM) image 1200 of a sample of CdSe/CdS quantum dots 1202 fabricated according to example 4, in accordance with an embodiment of the present invention.

Example 5

Reactive Ligand Exchange for Quantum Dot Structures 0.235 g of concentration-adjusted CdSe stock from Example 2 are exposed to a reactive exchange chemical, trimethylsilylpyrollidine (TMS-Pyr), for 20 minutes in an air-free environment and are mixed completely. After 20 minutes, an alcohol, usually 2-propanol or methanol is added to the mixture to quench the reactivity of the TMS-Pyr reagent, and to precipitate the reactively exchanged CdSe particles. The precipitated particles are centrifuged at 6000 RPM for 5 minutes. The resulting supernatant liquid is decanted and the precipitate are re-dissolved in 0.235 g of anhydrous toluene for use in the procedure described in Example 2. Reactive ligand exchange is used to introduce any number of desired surface functionalities to the surface of quantum dot cores prior to rod growth or the surface of the core/shell particles after synthesis.

Example 6

Coating Semiconductor Nanocrystalline Core/Shell Pairing with Silica Using Dioctyl Sodium Sulfosuccinate (AOT)

Approximately 4.5 g of AOT is dissolved in 50 mL of cyclohexane. 0.5 g of QDH is precipitated w/methanol, and then re-dissolved in hexane. 20 µL of 3-aminopropyltrimethoxysilane (APTMS) is added and stirred for 30 minutes. 900 µL of NH4OH (29 wt %) is added into the solution immediately followed by 600 µL of TEOS. The solution is stirred for about 16 hrs which allows the mixture to react until a silica shell coats the nanocrystal. The silica coated particles are precipitated by MeOH and the precipitated particles are separated from the supernatant using a centrifuge. The $SiO_2$ coated particles can be re-dispersed in toluene or left in cyclohexane.

Example 7

Coating a Semiconductor Nanocrystal with Silica Using IGEPAL CO-520

Approximately 4.46 g of Igepal CO-520 (Polyoxyethylene (5) nonylphenylether) is dissolved in 50 mL of cyclohexane and allowed to mix. "n" may be 3, 4, 5, 6, 7, 8, 9 or 10, preferably about 5. 0.5 grams of quantum dots dissolved in toluene are added. 20 µL of 3-APTMS is added and stirred for about 30 minutes. 900 µL of $NH_4OH$ (29 wt %) is added into the solution immediately followed by 600 µL of TEOS. The solution is stirred for about 16 hrs at 1600 rpm which allows the mixture to react until a silica shell coats the nanocrystal. The micelles are broken up by IPA and collected using a centrifuge. The $SiO_2$ coated particles may be re-dispersed in toluene or left in cyclohexane for polymer integration.

Example 8

Methoxy Silane Coupling Agent

Silica-shelled core-shell quantum dots are dispersed in 20 parts toluene to 1 part (MeO)3SiR (R=allyl or vinyl), and constantly stirred to allow the coupling reaction to take place. The functionalized particles are separated and cleaned by precipitation with IPA and centrifugation at 6000 rpm for 10 min. The process is repeated two or more times. Cleaned particles are dispersed in a known amount of toluene or polymer solution.

Example 9

Quantum Dot/Polymer Preparation

To prepare the films, a known mass of quantum dots in toluene or cyclohexane is added to premade polymer solution, depending on solvent compatibility of the polymer matrix used. Other solvents may also be used for dissolution, if so desired for polarity match with the matrix or to increase or decrease the viscosity or rate of solvent evolution from the cast film.

Example 10

Film Casting

The composite compositions are prepared by drop casting approximately 360 µL of QDH polymer solution onto a 12 mm glass round. The amount of quantum dots added to the polymer solution can be adjusted for different optical densities in the final QDH film. After casting films, the slow evaporation of solvent is important to give a film free of large surface imperfections. QDH-polymer solutions in toluene are allowed to evaporate in a vented fume hood. The films are cast on a level stainless plate. Once films are dried they are analyzed for PLQY and UV-Vis properties.

Example 11

The surface of silica-shelled quantum dot was functionalized using a variety of methoxy and ethoxy silanes: $(MeO)_3$SiAllyl, $(MeO)_3$SiVinyl, $(MeO)_2$SiMeVinyl, $(EtO)_3$SiVinyl, $EtOSi(Vinyl)_3$. The functionalized silica-shelled quantum dot was then used in the standard polymer formulation with additives for crosslinking, as well as without any further crosslinking co-agents such as TAIC in the case of EVA or divinylsilanes for siloxanes.

Example 12

In one embodiment, it is preferred that the olefin group is able to participate in a crosslinking process through radical mechanism in the case of EVA or through hydrosilylation process in the case of siloxanes. Allyl and vinyl are preferred, but other olefins can be included.

Example 13

In one embodiment, the degree of crosslinking may be increased using quantum dots with a higher density of the olefin groups on silica surface of quantum dots.

Example 14

Using Polarity

The surface of a silica-shelled particle is modified with organo-substituted silanes in order to maximize the compatibility with a polymer matrix such as the polysiloxanes for LEDs. The silica surface is modified with organo-substituted silanes, and its properties are therefore modified by the grafted functional groups.

Example 15

Pt Catalyst

A platinum-based catalyst may be introduced in Examples 9-14. In addition to the functionalized silica particles, two competing or complementary catalysts are available for cross-linking.

Example 16

Thiol Catalyst

The Pt catalyst of example 15 is replaced with a thiol catalyst with a thiol-ene reaction. Di-thiols or multifunctional thiols are used. The approach enables UV curing in place of heat curing.

Example 17

Coating a Semiconductor Nanocrystal with Silica Using Syringe Pump

Approximately 4.46 g of Igepal CO-520 (Polyoxyethylene (n) nonylphenylether) is dissolved in 50 mL of cyclohexane and allowed to mix. "n" may be 3, 4, 5, 6, 7, 8, 9 or 10, preferably about 5. 0.5 grams of quantum dots dissolved in toluene are added. 20 µL of 3-APTMS is added and stirred for about 30 minutes. 900 µL of $NH_4OH$ (29 wt %) is added into the solution immediately followed by adding 2000 µL of TEOS at a rate of 200 µL per hour using a syringe pump. After all the TEOS is added, the solution is stirred for about 16 hrs at 1600 rpm which allows the mixture to react until a silica shell coats the nanocrystal. The micelles are broken up by IPA and collected using a centrifuge. The $SiO_2$ coated particles may be re-dispersed in toluene or left in cyclohexane for polymer integration.

Example 18

Coating a Semiconductor Nanocrystal with Silica by Multiple Injections of TEOS

Approximately 4.46 g of Igepal CO-520 (Polyoxyethylene (n) nonylphenylether) is dissolved in 50 mL of cyclohexane and allowed to mix. "n" may be 3, 4, 5, 6, 7, 8, 9 or 10, preferably about 5. 0.5 grams of quantum dots dissolved in toluene are added. 20 µL of 3-APTMS is added and stirred for about 30 minutes. 900 µL of $NH_4OH$ (29 wt %) is added into the solution immediately followed by adding 150 µL of TEOS. Then 150 µL of TEOS is added every 2 hours, for a total of 600 µl during the course of the multiple TEOS injections (4× scenario). The solution is stirred for additional 16 hrs at 1600 rpm which allows the mixture to react until a silica shell coats the nanocrystal. The micelles are broken up by IPA and collected using a centrifuge. The $SiO_2$ coated particles may be re-dispersed in toluene or left in cyclohexane for polymer integration.

Example 19

Coating a Semiconductor Nanocrystal with Silica Using Potassium Hydroxide (KOH)

Approximately 4.46 g of Igepal CO-520 (Polyoxyethylene (n) nonylphenylether) is dissolved in 50 mL of cyclohexane and allowed to mix. "n" may be 3, 4, 5, 6, 7, 8, 9 or 10, preferably about 5. 0.5 grams of quantum dots dissolved in toluene are added. 20 µL of 3-APTMS is added and stirred for about 30 minutes. 450 µL of 0.55M KOH aqueous solution is added into the solution immediately followed by adding 600 µL of TEOS. The solution is stirred for about 16 hrs at 1600 rpm which allows the mixture to react until a silica shell coats the nanocrystal. The micelles are broken up by IPA and collected using a centrifuge. The $SiO_2$ coated particles may be re-dispersed in toluene or left in cyclohexane for polymer integration.

Example 20

Coating a Semiconductor Nanocrystal with Silica Using TBOS

Approximately 4.46 g of Igepal CO-520 (Polyoxyethylene (n) nonylphenylether) is dissolved in 50 mL of cyclohexane and allowed to mix. "n" may be 3, 4, 5, 6, 7, 8, 9 or 10, preferably about 5. 0.5 grams of quantum dots dissolved in toluene are added. 20 µL of 3-APTMS is added and stirred for about 30 minutes. 900 µL of $NH_4OH$ (29 wt %) is added into the solution immediately followed by 900 µL of TBOS. The solution is stirred for about 16 hrs at 1600 rpm which allows the mixture to react until a silica shell coats the nanocrystal. The micelles are broken up by IPA and collected using a centrifuge. The $SiO_2$ coated particles may be re-dispersed in toluene or left in cyclohexane for polymer integration.

Example 21

Coating a Semiconductor Nanocrystal with Silica Using TPOS

Approximately 4.46 g of Igepal CO-520 (Polyoxyethylene (n) nonylphenylether) is dissolved in 50 mL of cyclohexane and allowed to mix. "n" may be 3, 4, 5, 6, 7, 8, 9 or 10, preferably about 5. 0.5 grams of quantum dots dissolved in toluene are added. 20 µL of 3-APTMS is added and stirred for about 30 minutes. 900 µL of $NH_4OH$ (29 wt %) is added into the solution immediately followed by 750 µL of TPOS. The solution is stirred for about 16 hrs at 1600 rpm which allows the mixture to react until a silica shell coats the nanocrystal. The micelles are broken up by IPA and collected using a centrifuge. The $SiO_2$ coated particles may be re-dispersed in toluene or left in cyclohexane for polymer integration.

Example 22A

Coating a Semiconductor Nanocrystal with Silica without Using APTMS

Approximately 4.46 g of Igepal CO-520 (Polyoxyethylene (n) nonylphenylether) is dissolved in 50 mL of cyclohexane and allowed to mix. "n" may be 3, 4, 5, 6, 7, 8, 9 or 10, preferably about 5. 0.5 grams of quantum dots dissolved in toluene are added and stirred for about 10 minutes. 900 µL of $NH_4OH$ (29 wt %) is added into the solution immediately followed by adding 1200 µL of TEOS at a rate of 200 µL per hour using a syringe pump. The solution is stirred for a total of 16 hrs at 1600 rpm which allows the mixture to react until a silica shell coats the nanocrystal. The micelles are broken up by IPA and collected using a centrifuge. The $SiO_2$ coated particles may be re-dispersed in toluene or left in cyclohexane for polymer integration.

Example 22B

Additional Silica Shell Growth by Stober Process

Approximately 4.46 g of Igepal CO-520 (Polyoxyethylene (n) nonylphenylether) is dissolved in 50 mL of cyclohexane and allowed to mix. "n" may be 3, 4, 5, 6, 7, 8, 9 or 10, preferably about 5. 0.5 grams of quantum dots dissolved in toluene are added. 20 μL of 3-APTMS is added and stirred for about 30 minutes. 900 μL of $NH_4OH$ (29 wt %) is added into the solution immediately followed by 600 μL of TEOS. The solution is stirred for about 16 hrs at 1600 rpm which allows the mixture to react until a silica shell coats the nanocrystal. The micelles are broken up by IPA and collected using a centrifuge. The $SiO_2$ coated particles are re-dispersed in 50 mL of MeOH and 5 mL of water. To this solution, 2.8 mL of $NH_4OH$ (29 wt %) is added immediately followed by 0.5 mL of TEOS. Then 0.5 mL of TEOS is added every hour, for a total of 3.5 mL during the course of the multiple TEOS injections (7× scenario). The solution is stirred for additional 16 hrs at 1600 rpm which allows the mixture to react until a thick silica shell coats the nanocrystal. The micelles are broken up by IPA and collected using a centrifuge. The $SiO_2$ coated particles may be re-dispersed in toluene or left in cyclohexane for polymer integration.

Example 23

In Place Reaction 800 microliters of silica shelled quantum dots stored in toluene are added to a glass vial. The vial is centrifuged forming a pellet in the bottom; excess toluene is removed by decanting. 2.0 g of polymer are added the vial, additionally 40 microliters of a 3.0 M solution of KOH in methanol is added. The sample is mixed using one or more of the following methods: vortexer, ultra-sonication, and/or planetary mixer. 125 μl of QD-polymer solution is deposited on 12.5 mm glass coverslips. Films are cured in an oven for 2 hours at 150° C. Excess KOH will cause most types of polymer films to not cure as it can lead to backbiting of the polymeric reaction. Insufficient base will lead to sub-optimal performance. Adding the proper amount of base in relation to the total silica content of the reaction is vital. As some polymers contain silica in their formulations; this must be accounted for when determining the proper amount of KOH to add.

Example 24A

Pre-Treatment

KOH can be added to a pellet of silica shelled quantum dots where solvent has been removed via centrifugation and/or vacuum, or KOH can be added to silica shelled QDs suspended in a solvent. Typically, 800 μl of silica shelled quantum dots are added to a vial. Additional toluene is added to reach a volume of 2 mL. KOH in methanol is added to the vial in proportion to the amount of silica surrounding the quantum dots. The reaction is allowed to proceed until evolution of gas ceases. If the appropriate amount of KOH has been used, these particles need not undergo further processing; polymer can be added directly and subsequently cured as is done in example 23. Optionally, an excess of KOH can be used as the particles can be further washed with any number of solvents to remove excess unreacted KOH before the addition of polymer.

Example 24B

Heat Treatment

KOH can be added to a pellet of silica shelled quantum dots where solvent has been removed via centrifugation and/or vacuum. Typically, 800 μl of silica shelled quantum dots are added to a vial, and 50 mg of extra silica nanopowder is also added (optimally 20 nm sized particles), either powdered silica or QD-free silica which is produced via the micelle reactions listed in these examples. The part of the polymer without the catalyst is added (the base) along with 165 μl of 3M KOH in MeOH. The solution is mixed and heated at 150 C with occasional mixing for 45 min. Optionally further functionalization of the silica may be performed (adding, for example, a chemical group that can participate in the polymerization reaction) then the catalyst part is added and the mixture is cured as usual.

Example 25

Coating a Semiconductor Nanocrystal with Silica Via Direct Micelle with APTMS Approximately 2.23 g of AOT (Dioctyl sulfosuccinate sodium) is dissolved in 50 mL of water and allowed to mix. To 0.5 grams of quantum dots dissolved in toluene, 0.2 μl of 3-APTMS is added. The quantum dot solution is stirred for about 15 minutes and added dropwise to the AOT aqueous solution. 900 μL of $NH_4OH$ (29 wt %) is added into the solution immediately followed by adding 300 μL of TEOS. The solution is stirred for about 16 hrs at 1600 rpm which allows the mixture to react until a silica shell coats the nanocrystal. The micelles are broken up by IPA and collected using a centrifuge. The $SiO_2$ coated particles may be re-dispersed in toluene or left in cyclohexane for polymer integration.

Example 26

Coating a Semiconductor Nanocrystal with Silica Via Direct Micelle without APTMS Approximately 2.23 g of AOT (Dioctyl sulfosuccinate sodium) is dissolved in 50 mL of water and allowed to mix. 0.5 grams of quantum dots dissolved in toluene are added dropwise to the AOT aqueous solution. 900 μL of $NH_4OH$ (29 wt %) is added into the solution immediately followed by adding 300 μL of TEOS. The solution is stirred for about 16 hrs at 1600 rpm which allows the mixture to react until a silica shell coats the nanocrystal. The micelles are broken up by IPA and collected using a centrifuge. The $SiO_2$ coated particles may be re-dispersed in toluene or left in cyclohexane for polymer integration.

Example 27

Coating a Semiconductor Nanocrystal with Silica Via Direct Micelle by Multiple Injections of TEOS Approximately 2.23 g of AOT (Dioctyl sulfosuccinate sodium) is dissolved in 50 mL of water and allowed to mix. To 0.5 grams of quantum dots dissolved in toluene, 0.2 ul of 3-APTMS is added. The quantum dot solution is stirred for about 15 minutes and added dropwise to the AOT aqueous solution. 900 μL of $NH_4OH$ (29 wt %) is added into the solution immediately followed by adding 300 μL of TEOS. Then, 300 μL of TEOS is added every 2 hours, for a total of 1200 ul during the course of the multiple TEOS injections. The solution is stirred for about 16 hrs at 1600 rpm which allows the mixture to react until a silica shell coats the nanocrystal. The micelles are broken up by IPA and collected using a centrifuge. The $SiO_2$ coated particles may be re-dispersed in toluene or left in cyclohexane for polymer integration.

Thus, networks of semiconductor structures with fused insulator coatings and methods of fabricating networks of semiconductor structures with fused insulator coatings have been disclosed. In accordance with an embodiment of the present invention, a semiconductor structure includes an insulator network. A plurality of discrete semiconductor nanocrystals is disposed in the insulator network. Each of the plurality of discrete semiconductor nanocrystals is spaced apart from one another by the insulator network. It is to be understood that the terms, "coat," "coating," "shell" and "shelling" are used interchangeably throughout. It is to be understood that phosphors may be included in such an insulator network in addition to, or instead of, quantum dots.

What is claimed is:

1. A method of fabricating a semiconductor structure, the method comprising:
    forming a mixture comprising a plurality of discrete semiconductor nanocrystals, each of the plurality of discrete semiconductor nanocrystals discretely coated by an insulator shell; and
    adding a base to the mixture to fuse the insulator shells of each of the plurality of discrete nanocrystals, providing an insulator network, wherein each of the plurality of discrete semiconductor nanocrystals is spaced apart from one another by the insulator network, and wherein the base is selected from the group consisting of LiOH, RbOH, CsOH, MgOH, $Ca(OH)_2$, $Sr(OH)_2$, $Ba(OH)_2$, $(Me)_4NOH$, $(Et)_4NOH$, and $(Bu)_4NOH$.

2. The method of claim 1, wherein the base is selected from the group consisting of LiOH, RbOH, CsOH, MgOH, $(Me)_4NOH$, $(Et)_4NOH$, and $(Bu)_4NOH$, and adding the base to the mixture comprises adding one mole of the base for every two moles of material of the insulator shells.

3. The method of claim 1, wherein the base is selected from the group consisting of $Ca(OH)_2$, $Sr(OH)_2$ and $Ba(OH)_2$, and adding the base to the mixture comprises adding one mole of the base for every four moles of material of the insulator shells.

4. The method of claim 1, further comprising:
    adding free silica to the mixture.

5. The method of claim 4, wherein adding free silica to the mixture comprises adding the free silica after adding the base to the mixture.

6. The method of claim 4, wherein adding free silica to the mixture comprises adding the free silica prior to adding the base to the mixture.

7. The method of claim 1, wherein forming the mixture comprises using tetraethylorthosilicate to form the insulator shell for each of the discrete semiconductor nanocrystals discretely coated by the insulator shell.

8. The method of claim 1, wherein the insulator shells of each of the plurality of discrete nanocrystals and the resulting insulator network comprise silica.

* * * * *